US012781020B2

(12) United States Patent
Tsunematsu et al.

(10) Patent No.: US 12,781,020 B2
(45) Date of Patent: Nov. 3, 2026

(54) ELECTROMAGNETIC WAVE ABSORBING PARTICLES, ELECTROMAGNETIC WAVE ABSORBING PARTICLE DISPERSION LIQUID, ELECTROMAGNETIC WAVE ABSORBING PARTICLE DISPERSION, AND ELECTROMAGNETIC WAVE ABSORBING LAMINATE

(71) Applicant: SUMITOMO METAL MINING CO., LTD., Tokyo (JP)

(72) Inventors: Hirofumi Tsunematsu, Chiba (JP); Keisuke Machida, Chiba (JP); Masao Wakabayashi, Chiba (JP); Kenji Adachi, Chiba (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 349 days.

(21) Appl. No.: 18/262,105

(22) PCT Filed: Feb. 1, 2022

(86) PCT No.: PCT/JP2022/003871
§ 371 (c)(1),
(2) Date: Jul. 19, 2023

(87) PCT Pub. No.: WO2022/168838
PCT Pub. Date: Aug. 11, 2022

(65) Prior Publication Data
US 2024/0052135 A1 Feb. 15, 2024

(30) Foreign Application Priority Data
Feb. 2, 2021 (JP) ................................ 2021-015182

(51) Int. Cl.
*C08K 3/22* (2006.01)
*H05K 9/00* (2006.01)

(52) U.S. Cl.
CPC ............. *C08K 3/22* (2013.01); *H05K 9/0081* (2013.01); *C08K 2003/2206* (2013.01); *C08K 2201/003* (2013.01)

(58) Field of Classification Search
CPC .............. C08K 3/22; C08K 2003/2206; C08K 2201/003; H05K 9/00; H05K 9/0081
See application file for complete search history.

(56) References Cited

U.S. PATENT DOCUMENTS

2006/0178254 A1 8/2006 Takeda et al.
2013/0052535 A1* 2/2013 Yanagihara ......... H01M 4/5825 977/773
(Continued)

FOREIGN PATENT DOCUMENTS

JP H09-107815 4/1997
JP 2003-029314 1/2003
(Continued)

OTHER PUBLICATIONS

Yingtao Zhu, Ying Dai, Kangrong Lai, Zhujie Li, and Baibiao Huang, Optical Transition and Photocatalytic Performance of d1 Metallic Perovskites, J. Phys. Chem. C, 117, 5593-5598. (Year: 2013).*
(Continued)

*Primary Examiner* — Bijan Ahvazi
(74) *Attorney, Agent, or Firm* — IPUSA, PLLC

(57) ABSTRACT

With respect to electromagnetic wave absorbing particles that contain a composite oxide, the composite oxide includes an element A that is one or more elements selected from H, an alkali metal, Mg, and an alkaline earth metal, and an element B that is one or more elements selected from V, Nb, and Ta, wherein a relationship of $0.001 \le x/y \le 1.5$ is satisfied
(Continued)

50 when an amount of substance of the element A contained in the composite oxide is x and an amount of substance of the element B is y.

11 Claims, 3 Drawing Sheets

(56) References Cited

U.S. PATENT DOCUMENTS

| | | | |
|---|---|---|---|
| 2023/0052771 | A1 | 2/2023 | Adachi et al. |
| 2023/0070110 | A1 | 3/2023 | Adachi et al. |

FOREIGN PATENT DOCUMENTS

| | | | | | |
|---|---|---|---|---|---|
| JP | 2011-184273 | | | 9/2011 | |
| JP | 2012-007024 | | | 1/2012 | |
| JP | 2012007024 | A | * | 1/2012 | ............... C08K 3/24 |
| JP | 2014-169416 | | | 9/2014 | |
| JP | 2018-077301 | | | 5/2018 | |
| JP | 2018077301 | A | * | 5/2018 | ............... C09K 3/00 |
| WO | 2005/037932 | | | 4/2005 | |
| WO | 2021/153692 | | | 8/2021 | |
| WO | 2021/153693 | | | 8/2021 | |

OTHER PUBLICATIONS

In-Sun Cho , Dong Wook Kim, Chin Moo Cho, Jae-Sul An, Hee-Suk Roh, Kug Sun Hong, Synthesis, characterization and photocatalytic properties of CaNb2O6 with ellipsoid-like plate morphology, Solid StateSciences 12(2010)982-988. (Year: 2010).*

Yingtao Zhu et al., "Optical Transition and Photocatalytic Performance of d1 Metallic Perovskites", The Journal of Physical Chemistry C, 2013, 117, pp. 5593-5598, doi: 10.1021/jp31211116.

Chuyang Liu et al., "Formation of BaFe12-xNbxO19 and its high electromagnetic wave absorption properties in millimeter wave frequency range", Journal of the American Ceramic Chemistry, 2017, 100, pp. 3999-4010, doi: 10.1111/jace.14925.

Bradley Bobbs et al., "Electrooptic Devices For Millimeter Waves Using Cooled Ferroelectrics", Proceedings of SPIE, the International Society for Optical Engineering, 1985, 545, pp. 35-38, doi: 10.1117/12.948342.

International Search Report mailed on Apr. 12, 2022 with respect to PCT/JP2022/003871.

Svensson et al: "Ba"2Nb"5O"9—An intergrowth of BaNbO"3 (perovskite) and NbO", Materials Research Bulletin, Elsevier, Kidlington, GB, vol. 23, No. 3, Mar. 1, 1988 (Mar. 1, 1988), pp. 437-446, XP024358204, ISSN: 0025-5408, DOI: 10.1016/0025-5408(88)90018-9 [retrieved on Mar. 1, 1988].

Hessen B et al: "Crystallization of Reduced Strontium and Barium Niobate Perovskites From Borate Fluxes", Materials Research Bulletin, Elsevier, Kidlington, GB, vol. 26, No. 1, Jan. 1, 1991 (Jan. 1, 1991), pp. 85-90, XP000204812, ISSN: 0025-5408, Doi: 10.1016/0025-5408(91)90041-J.

Svensson G et al: "Determination of the composition of BaNbO"3 using profile refinement and phase analysis", Materials Research Bulletin, Elsevier, Kidlington, GB, vol. 25, No. 1, Jan. 1, 1990 (Jan. 1, 1990), pp. 9-14, XP024080147, ISSN: 0025-5408, DOI: 10.1016/0025-5408(90)90156-V [retrieved on Jan. 1, 1990].

Zhukovsky V M et al: "Investigation of s, p. d-element Niobates and Their Solid Solution Formation Processes by Thermal Analysis", Journal of Thermal Analysis and Calorimetry, Kluwer Academic Publishers, Dordrecht, NL, vol. 60, No. 2, May 1, 2000 (May 1, 2000), pp. 523-534, XP019253311, ISSN: 1572-8943.

* cited by examiner

ELECTROMAGNETIC WAVE ABSORBING PARTICLES, ELECTROMAGNETIC WAVE ABSORBING PARTICLE DISPERSION LIQUID, ELECTROMAGNETIC WAVE ABSORBING PARTICLE DISPERSION, AND ELECTROMAGNETIC WAVE ABSORBING LAMINATE

TECHNICAL FIELD

The present invention relates to electromagnetic wave absorbing particles, an electromagnetic wave absorbing particle dispersion liquid, an electromagnetic wave absorbing particle dispersion, and an electromagnetic wave absorbing laminate.

BACKGROUND OF THE INVENTION

According to the fifth edition of the Physical and Chemical Dictionary, light is defined as "Electromagnetic waves with wavelengths in the range of about 1 nm to 1 mm are called light". This range of wavelengths includes the visible light region and the infrared region.

Near-infrared rays included in sunlight pass through a window material or the like and enter a room to increase surface temperatures of a wall and a floor in the room and also increase an indoor air temperature. In order to make indoor thermal environment comfortable, it has been conventionally performed to prevent indoor temperature from rising by blocking near-infrared rays that enter through windows, for example, by using light-shielding materials for window materials.

As light shielding materials used for a window material or the like, Patent Document 1 proposes a light shielding film containing black fine powder including inorganic pigments such as carbon black, titanium black, and the like, or organic pigments such as aniline black and the like.

In addition, Patent Document 2 discloses a thermal insulating sheet in which a belt-like film having infrared reflectivity and a belt-like film having infrared absorptivity are used as warps or wefts to form a knitted or woven fabric. Patent Document 2 also discloses that a synthetic resin film subjected to aluminum vapor deposition processing and further laminated with a synthetic resin film is used as the belt-like film having infrared reflectivity.

The applicants of the present invention proposed in Patent Document 3 an infrared shielding material fine particle dispersion in which infrared material fine particles are dispersed in a solvent, the infrared material fine particles contain tungsten oxide fine particles and/or composite tungsten oxide fine particles, and the dispersed particle diameter of the infrared material fine particles is in a range from 1 nm to 800 nm.

RELATED-ART DOCUMENT

Patent Document

[Patent Document 1] Japanese Patent Application Laid-Open No. 2003-029314

[Patent Document 2] Japanese Unexamined Patent Application Publication No. H9(1997)-107815

[Patent Document 3] International Publication No. 2005/037932

SUMMARY OF THE INVENTION

Problems to be Solved by the Invention

In recent years, electromagnetic wave absorbing particles capable of absorbing electromagnetic waves such as infrared rays have been used in various applications, and new electromagnetic wave absorbing particles have been demanded so that suitable materials can be selected in accordance with the application.

In view of the above, an object of one aspect of the present invention is to provide novel electromagnetic wave absorbing particles.

Means for Solving the Problems

According to one aspect of the present invention, with respect to electromagnetic wave absorbing particles that contain a composite oxide, the composite oxide includes an element A that is one or more elements selected from H, an alkali metal, Mg, and an alkaline earth metal, and an element B that is one or more elements selected from V, Nb, and Ta, wherein a relationship of $0.001 \leq x/y \leq 1.5$ is satisfied when an amount of substance of the element A contained in the composite oxide is x and an amount of substance of the element B is y.

Effects of the Invention

According to one aspect of the present invention, novel electromagnetic wave absorbing particles can be provided.

DETAILED DESCRIPTION OF THE INVENTION

Figure 1:
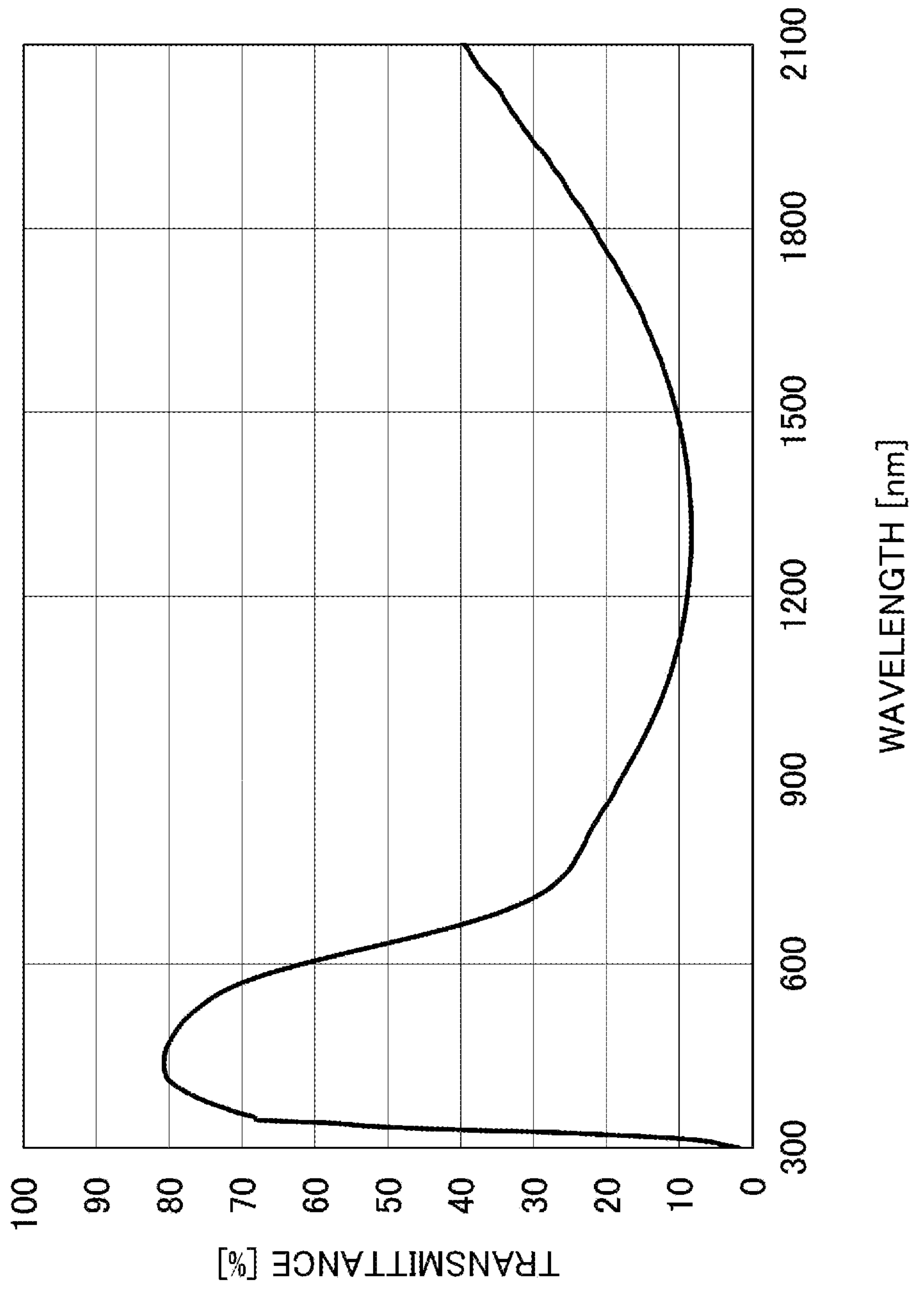
FIG. 1 is a graph of a transmitted light profile of an electromagnetic wave absorbing particle dispersion liquid according to Example 1.

Hereinafter, [1] electromagnetic wave absorbing particles, [2] a method of producing electromagnetic wave absorbing particles, [3] an electromagnetic wave absorbing particle dispersion liquid, [4] an electromagnetic wave absorbing particle dispersion, and [5] an electromagnetic wave absorbing laminate will be described in detail in this order.

[1] Electromagnetic Wave Absorbing Particles

The inventors of the present invention have studied novel electromagnetic wave absorbing particles. The type of electromagnetic waves absorbed by the electromagnetic wave absorbing particles is not particularly limited, but as described above, electromagnetic wave absorbing particles that absorb Infrared rays or near infrared rays are particularly demanded. Therefore, the electromagnetic wave absorbing particles according to the present embodiments are preferably infrared absorbing particles that absorb infrared rays, and more preferably near infrared absorbing particles that absorb near infrared rays.

The inventors of the present invention focused on an oxide of the group 5 elements when studying novel electromagnetic wave absorbing particles. However, since effective free electrons or holes do not exist in the pentoxide ($V_2O_5$, $Nb_2O_5$, $Ta_2O_5$) of the group 5 elements, absorption and reflection characteristics in the infrared region are low, and the pentoxides ($V_2O_5$, $Nb_2O_5$, $Ta_2O_5$) of the group 5 elements are not effective as infrared absorbing materials. However, when a composite oxide is formed by adding an electropositive element to the above oxide, free electrons or holes are generated in the composite oxide, so that absorption characteristics derived from the free electrons or holes are exhibited in the infrared region. Therefore, it has been found that novel electromagnetic wave absorbing particles can be obtained.

Furthermore, the inventors of the present invention have found that there is a particularly effective range as the electromagnetic wave absorbing particles in a specific portion of the composition range of the composite oxide. Specifically, the present inventors have found that by setting the composition range of the composite oxide to a predetermined range, the composite oxide is transparent in the visible light region and has absorption in the Infrared region, thereby completing the present invention.

(Composition of Composite Oxide)

The electromagnetic wave absorbing particles of the present embodiment can contain a composite oxide. The composite oxide can contain an element A which is one or more elements selected from H, an alkali metal, Mg, and an alkaline earth metal, and an element B which is one or more elements selected from V, Nb, and Ta.

When the amount of substance of the element A contained in the composite oxide is x and the amount of substance of the element B contained in the composite oxide is y, it is preferable that the relationship $0.001 \leq x/y \leq 1.5$ is satisfied.

The electromagnetic wave absorbing particles of the present embodiment may be composed of only the composite oxide. However, even in this case, the case where the electromagnetic wave absorbing particles of the present embodiment contain inevitable impurities mixed in the manufacturing process or the like is not excluded.

As described above, when the element A, which is a positive element, is added to the oxide containing the element B to form the composite oxide, electromagnetic wave absorption characteristics can be exhibited. As described above, the element A is preferably one or more elements selected from H, alkali metals, Mg, and alkaline earth metals. In particular, from the viewpoint of improving the stability of the composite oxide, the element A is preferably an alkaline earth metal, that is, one or more elements selected from Ca, Sr, Ba, and Ra, and more preferably one or more elements selected from Ca, Sr, and Ba.

The element B can be one or more elements selected from V, Nb, and Ta as described above, is preferably one or more elements selected from Nb and Ta, and is more preferably Nb.

When the value of x/y indicating the content ratio of the amount of substance of the element A to the amount of substance of the element B in the composite oxide is 0.001 or more as described above, a sufficient amount of free electrons or holes is generated in the composite oxide, and the desired electromagnetic wave absorption effect can be obtained. As the content of the element A increases, the supply amount of free electrons increases and the electromagnetic wave absorption efficiency also increases. However, the effect is saturated when the value of x/y is about 1.5. In addition, when the value of x/y is 1.5 or less, generation of an impurity phase in the electromagnetic wave absorbing particles can be avoided. Therefore, as described above, the value of x/y preferably satisfies $0.001 \leq x/y \leq 1.5$, more preferably satisfies $0.5 \leq x/y \leq 1.0$, and further preferably satisfies $0.7 \leq x/y \leq 1.0$.

The composite oxide can be represented by, for example, a general formula $A_xB_yO_z$. In the general formula, A represents the element A, B represents the element B, and O represents oxygen, and the composite oxide is preferably composed of, for example, the element A, the element B, and oxygen as represented by the general formula.

As described above, by adding the element A to the oxide containing the element B, free electrons or holes are supplied to the composite oxide, and electromagnetic wave absorption characteristics can be exhibited. Therefore, the amount of oxygen contained in the composite oxide is not particularly limited. However, by setting the oxygen amount to a predetermined range, the amount of free electrons or holes in the composite oxide can be set to a particularly suitable range from the viewpoint of enhancing the electromagnetic wave absorption characteristics. Therefore, the value of z/y corresponding to the content ratio of oxygen to the element B in the composite oxide is preferably $1.0 < z/y < 3.5$, more preferably $2.0 < z/y < 3.5$, even more preferably $2.0 < z/y \leq 3.0$, and most preferably $2.4 \leq z/y < 3.0$.

As described above, the value of z/y corresponds to the content ratio of oxygen to the element B in the composite oxide, and is a value that affects the oxygen deficiency amount or the oxygen excess amount of the composite oxide. As described above, the amount of free electrons or holes in the composite oxide can also be controlled by the amount of oxygen. Therefore, it is preferable to control the value of z/y in accordance with the required electromagnetic wave absorption characteristics and the like. The value of z/y can be easily controlled by the synthesis conditions and the like of the electromagnetic wave absorbing particles.

When the element A is divalent, for example, when the element A is one or more elements selected from Ca, Sr, Ba, and Ra, x, y, and z in the general formula $A_xB_yO_z$ preferably satisfy $-1 \leq (2x+5y-2z)/y \leq 5$, more preferably satisfy $0 \leq (2x+5y-2z)/y \leq 3.5$, further preferably satisfy $0.5 \leq (2x5y-2z)/y \leq 2.5$, and particularly preferably satisfy $1 \leq (2x+5y-2z)/y \leq 2.5$. The above $(2x+5y-2z)/y$ indicates a measure of the excess or deficiency of electrons per element B when element A is divalent, and when the above range is satisfied, a particularly high electromagnetic wave-absorbing effect can be exhibited.

(Crystal Structure and Lattice Constant of Composite Oxide)

According to studies by the inventors of the present invention, when the composite oxide has any crystal structure selected from a cubic crystal structure, a tetragonal crystal structure, and an orthorhombic crystal structure, transmission of light particularly in a visible light region is improved, and absorption of light in an infrared region is improved. However, in order to obtain the effect of improving the transmission of light in the visible light region and improving the absorption of light in the infrared region, the composite oxide may contain a unit structure of a cubic crystal structure, a tetragonal crystal structure, or an orthorhombic crystal structure, and the composite oxide may partially contain an amorphous structure or another structure.

When the value of x/y representing the content ratio of the amount of substance of the element A to the amount of substance of the element B in the composite oxide is 1.0 and the value of z/y representing the content ratio of the amount of substance of oxygen to the amount of substance of the element B in the composite oxide is 3.0, the crystal structure of the composite oxide is a cubic perovskite structure. Specifically, $SrNbO_3$, $BaNbO_3$, and the like have a cubic perovskite structure. With this as a basic structure, when the value of x/y is less than 1.0, a cubic perovskite structure having a deficiency of the element A may be obtained. In addition, when the value of z/y is less than 3.0, a cubic perovskite structure having oxygen deficiency may be formed. Furthermore, depending on the deficient state of each element, a tetragonal or orthorhombic crystal structure in which $ABO_3$ blocks and BO blocks are regularly stacked may be formed. In addition, when the value of z/y is greater than 3.0 and less than 3.5, the crystal structure may be a cubic, tetragonal, or orthorhombic crystal structure.

As the electromagnetic wave absorbing particles, a material having a high electromagnetic wave absorption in an infrared region and a low electromagnetic wave absorption in a visible light region is often required. However, since the required performance varies depending on the application or the like, it is not generally determined which one of the above-described crystal structures is preferable.

The absorption wavelengths of the electromagnetic wave-absorbing particles of the present embodiment are often around 780 nm which is the boundary between the visible light region and the infrared region. However, depending on the crystal structure of the composite oxide contained or the presence or absence of element defects, the absorption wavelength of the electromagnetic wave may shift to the short wavelength side or the electromagnetic wave absorption may increase, and as a result, the visible light transparency may decrease.

For example, in the case of a $Sr_xNbO_z$ ($2.0<z\leq3.0$), for example, when the value of x is 0.8 or more and 0.9 or less, a cubic perovskite structure having a deficiency of Sr and an oxygen deficiency in some cases, or a tetragonal or orthorhombic crystal structure in which $SrNbO_3$ blocks and NbO blocks are regularly stacked is formed. At this time, the heat-shielding characteristic which is regarded as important in a window material or the like tends to be high. The heat-shielding characteristic means a characteristic determined by a balance between visible light transparency and near-infrared absorption.

On the other hand, in the $Sr_xNbO_z$ ($2.0<z\leq3.0$), when the value of x is 1.0, a cubic perovskite structure having oxygen deficiency or a tetragonal or orthorhombic crystal structure having Nb deficiency and oxygen deficiency in which $SrNbO_3$ blocks and NbO blocks are regularly stacked is formed, and electromagnetic absorption tends to increase. However, at the same time, there is a tendency that the absorption wavelength shifts to the short wavelength side, the visible light transparency decreases, and the heat shielding characteristic also decreases. However, there is a case where all of Sr, Nb, and oxygen are deficient and strontium polyniobate having a huge unit lattice is obtained, and there is a case where the above tendency is not satisfied. When the amount of deficient Nb increases, the value of x may exceed 1.0.

As described above, since the relationship between the crystal structure and the electromagnetic wave absorption characteristics changes depending on the composition of the composite oxide, the crystal structure of the composite oxide contained in the electromagnetic wave absorbing particles of the present embodiment is not particularly limited and can be selected according to the composition of the composite oxide, the required electromagnetic wave absorption characteristics, and the like.

The lattice constant of the composite oxide is not particularly limited, but the lattice constant of the a-axis based on the cubic perovskite structure is preferably 3.965 Å or more and 4.045 Å or less, more preferably 3.975 Å or more and 4.035 Å or less, and even more preferably 3.983 Å or more and 4.029 Å or less. The lattice constant can be calculated by Rietveld analysis.

(Particle Characteristics of Electromagnetic Wave Absorbing Particles)

The particle characteristics such as the particle diameter or the like of the electromagnetic wave absorbing particles of the present embodiment are not particularly limited, and can be arbitrarily selected according to the required electromagnetic wave absorbing characteristics and the like.

The electromagnetic wave absorbing particles of the present embodiment preferably have a cumulative 50% particle diameter on a volume basis of 1 nm or more and 50 nm or less and a cumulative 95% particle diameter on a volume basis of 5 nm or more and 100 nm or less as measured by a particle size distribution measuring apparatus.

In general, it has been known that a material containing free electrons or holes exhibits a reflection and absorption response to electromagnetic waves in the vicinity of a region of sunlight having wavelengths in a range from 200 nm to 2600 nm by plasma oscillation. It has been known that when the powder particles of such a material are smaller than the wavelength of light, geometric scattering in the visible light region (wavelength 380 nm or more and 780 nm or less) is reduced and transparency in the visible light region is obtained.

In this specification, the term "transparency" means that "light in the visible light region is less scattered and has high transmittance".

Therefore, when the electromagnetic wave-absorbing particles of the present embodiment are used in applications where transparency in the visible light region is required, the cumulative 95% particle diameter on a volume basis measured with a particle size distribution analyzer is preferably 100 nm or less. This is because particles having a cumulative 95% particle diameter of 100 nm or less do not completely block light due to scattering, and can maintain visibility in the visible light region and simultaneously efficiently maintain transparency. In particular, when transparency in the visible light region is regarded as important, it is preferable to further consider scattering by particles.

When further reduction of scattering by the electromagnetic wave absorbing particles is required, the cumulative 95% particle diameter is more preferably 70 nm or less and even more preferably 50 nm or less. When the particle diameter of the electromagnetic wave absorbing particles is small, scattering of light in the visible light region of wavelengths from 380 nm to 780 nm due to geometric scattering or Mie scattering is reduced. Therefore, by setting the cumulative 95% particle diameter of the electromagnetic wave absorbing particles in the above range, for example, it is possible to more reliably avoid a situation in which an electromagnetic wave absorbing particle dispersion using the electromagnetic wave absorbing particles becomes like a cloudy glass and clear transparency is not obtained. When the cumulative 95% particle diameter is 70 nm or less, the geometric scattering or the Mie scattering is reduced and the region becomes the Rayleigh scattering region. Since the scattered light is proportional to the sixth power of the particle diameter in the Rayleigh scattering region, the scattering is reduced and the transparency is improved as the particle diameter decreases.

Further, when the cumulative 95% particle diameter is 50 nm or less, the amount of scattered light is reduced, which is preferable. From the viewpoint of avoiding scattering of light, it is preferable that the cumulative 95% particle diameter is small. Therefore, the lower limit of the cumulative 95% particle diameter is not particularly limited, but the cumulative 95% particle diameter is preferably 5 nm or more. This is because manufacturing process becomes easy when the cumulative 95% particle diameter is 5 nm or more.

As described above, when the cumulative 95% particle diameter is adjusted to 100 nm or less, the haze value of the electromagnetic wave absorbing particle dispersion in which the electromagnetic wave absorbing particles of the present embodiment are dispersed in a solid medium can reach to 30% or less at a visible light transmittance of 85% or less. When the haze value is 30% or less, particularly clear transparency can be obtained.

From the viewpoint of obtaining particularly excellent electromagnetic wave absorbing characteristics, the cumulative 50% particle diameter on a volume basis of the electromagnetic wave absorbing particles measured by a particle size distribution measuring apparatus is preferably 1 nm or more. However, from the viewpoint of enhancing the transparency in the visible light region, the cumulative 50% particle diameter is preferably 50 nm or less for the same reason as with the cumulative 95% particle diameter.

The cumulative 50% particle diameter and the cumulative 95% particle diameter of the electromagnetic wave absorbing particles can be measured using a particle size distribution measuring device (for example, UPA-150, manufactured by Nikkiso Co., Ltd.) based on a dynamic light scattering method analyzed by a frequency analysis method.

The particle size distribution data is expressed as a cumulative percentage or a frequency percentage with respect to a particle diameter scale, but may also be expressed as a particle diameter with respect to a cumulative percentage scale. For example, a particle diameter at a point where a distribution curve expressed as a particle diameter with respect to a scale of cumulative percentage intersects a horizontal axis of 10% is referred to as a cumulative 10% particle diameter, a particle diameter at a point where the distribution curve intersects a horizontal axis of 50% is referred to as a cumulative 50% particle diameter, and a particle diameter at a point where the distribution curve intersects a horizontal axis of 95% is referred to as a cumulative 95% particle diameter. The cumulative percentage is not particularly fixed to 10%, 50%, or 95%, and any cumulative percentage may be used as necessary. The 50% particle diameter is also called a median diameter and is generally used. When the sizes of the particle size distributions of a plurality of samples are compared, the size of the measurement target needs to be represented by one numerical value, and thus the median diameter is often used. For this reason, the median diameter is often confused with the mean particle diameter. The definitions of these are different and usually the two diameters do not coincide. These two diameters coincide only if the particle size distribution is symmetrical about the center (50% particle diameter).

[2] Method of Producing Electromagnetic Wave Absorbing Particles

Next, a method of producing the electromagnetic wave absorbing particles of the present embodiment will be described. Since the above-described electromagnetic wave absorbing particles can be produced by the method of producing electromagnetic wave absorbing particles of the present embodiment, the description of the matters already described will be partially omitted.

The electromagnetic wave absorbing particles of the present embodiment can be produced by a solid phase reaction method. When the electromagnetic wave absorbing particles are synthesized by the solid phase reaction method, an element A compound and an element B compound can be used as raw materials.

The method of producing electromagnetic wave absorbing particles of the present embodiment may include a mixed powder preparation step (first mixed powder preparation step) of preparing a mixture of the element A compound or an element A elementary substance and the element B compound or an element B elementary substance.

The element A compound or the element A elementary substance can be used as an element A source. The element A compound as a raw material is preferably one or more kinds selected from oxides, hydroxides, carbonates, nitrates, sulfates, oxalates, organic compounds, sulfides, and chlorides of the element A.

Since the preferred element A has already been described, the description thereof is omitted here.

The element B compound or the element B elementary substance as an element B source is preferably at least one selected from the group consisting of pentoxide ($V_2O_5$, $Nb_2O_5$, $Ta_2O_5$), dioxide ($VO_2$, $NbO_2$, $TaO_2$), sesquioxide ($V_2O_3$, $Nb_2O_3$), elementary substance metals (V, Nb, Ta), sulfates, ammonium salts, organic compounds, sulfides, chlorides, and hydrates of oxides obtained by dissolving chlorides in a liquid such as alcohol, hydrolyzing the solution with water, and evaporating the solvent. Since the preferable element B has already been described, the description thereof is omitted here.

In the mixed powder preparation step, a specific procedure for obtaining a mixed powder of the element A compound or the element A elementary substance and the element B compound or the element B elementary substance is not particularly limited. For example, a method of dry-mixing the element A compound or the like and the element B compound or the like in a powder state to obtain a mixed powder can be used. The mixed powder can also be obtained by dissolving the element A compound or the like in water, wet-mixing the solution with the element B compound or the like, and then drying the mixture.

In the mixed powder preparation step, the mixing is preferably performed such that the ratio of the amount of the element A to the amount of the element B in the obtained mixed powder is equal to the ratio of the amount of substance of the element A to the amount of substance of the element B in the target composite oxide. That is, they are preferably mixed so as to satisfy A:B=x:y, which is the ratio of the amount of substance (A) of the element A to the amount of substance (B) of the element B in the composite oxide. As described above, x/y preferably satisfies $0.001 \leq x/y \leq 1.5$, more preferably satisfies $0.5 \leq x/y \leq 1.0$, and further preferably satisfies $0.7 \leq x/y \leq 1.0$. Therefore, it is preferable to mix the element A compound or the like and the element B compound or the like so as to be in the above-described preferable range.

The electromagnetic wave absorbing particles of the present embodiment can be synthesized in multiple stages in order to obtain electromagnetic wave absorbing particles containing the composite oxide having a target composition. In this case, in the first mixed powder preparation step, the element A compound or the like and the element B compound or the like can be mixed so as to have a composition of the intermediate product.

The method of producing electromagnetic wave absorbing particles of the present embodiment may include a firing step (first firing step) of firing the mixed powder obtained in the mixed powder preparation step.

The conditions of the firing step are not particularly limited. In the firing step, for example, the mixed powder can be fired in any atmosphere selected from an inert gas alone atmosphere, a reducing gas alone atmosphere, a vacuum atmosphere, a mixed gas atmosphere of an inert gas and a reducing gas, and an oxidizing atmosphere containing oxygen.

For example, in the case where oxygen deficiency is introduced into the composite oxide to make the value of z/y in the above-described general formula smaller than the stoichiometric ratio, the firing atmosphere is preferably a mixed gas atmosphere of an inert gas and a reducing gas. The reducing gas is not particularly limited, but is preferably, for example, hydrogen gas. When hydrogen gas is used as the reducing gas, the volume ratio of hydrogen gas is preferably 1% or more and more preferably 3% or more. The upper limit of the volume ratio of the hydrogen gas is not particularly limited, and can be 100% at the maximum because the reducing gas alone can be used.

The inert gas is not particularly limited, and one or more selected from nitrogen gas, noble gas, and the like can be used.

The oxidizing atmosphere is an atmosphere containing oxygen. For example, an atmosphere containing oxygen at a volume ratio higher than or equal to 18% and lower than or equal to 100% can be used. For example, an air atmosphere can be used.

The condition of the firing temperature in the firing step is not particularly limited, but the firing temperature is preferably not lower than the temperature at which the formed composite oxide starts to crystallize and not higher than the melting point of the composite oxide. Specifically, for example, the firing temperature is preferably 1000° C. or higher and 2100° C. or lower.

The electromagnetic wave absorbing particles of the present embodiment can be synthesized in multiple stages in order to obtain electromagnetic wave absorbing particles containing the composite oxide having a target composition. When the synthesis is performed in multiple stages, the element B compound or the element B elementary substance can be further added to and mixed with the intermediate product obtained in the firing step (first firing step) (a second mixed powder preparation step). The element B compound or the like used at this time is not particularly limited, and for example, the compound described in the first mixed powder preparation step can be used. In the second mixed powder preparation step, the mixing is preferably performed such that the ratio of the amount of the element A to the amount of the element B in the obtained mixed powder is to be the ratio of the amount of substance of the element A to the amount of substance of the element B in the target composite oxide. That is, they are preferably mixed so as to satisfy A:B=x:y, which is the ratio of the amount of substance (A) of the element A to the amount of substance (B) of the element B in the composite oxide. Since the mixing can be performed in the same manner as in the mixed powder preparation step, the description thereof is omitted here.

Then, the obtained mixed powder is subjected to the firing step (second firing step) to prepare the electromagnetic wave absorbing particles of the present embodiment. The conditions of the second firing step are not particularly limited, but the firing atmosphere and the firing temperature can be the same as those described in the firing step (first firing step) described above, for example, and thus the description thereof is omitted here. It should be noted that the firing conditions in the first firing step and the second firing step may be the same or different.

By performing the steps described above, the electromagnetic wave absorbing particles of the present embodiment can be obtained. After the completion of the firing step, the obtained electromagnetic wave absorbing particles may be crushed, pulverized, sieved, or the like as necessary to obtain a desired particle size distribution.

[3] Electromagnetic Wave Absorbing Particle Dispersion Liquid

Next, the electromagnetic wave absorbing particle dispersion liquid of the present embodiment will be described.

Figure 2:
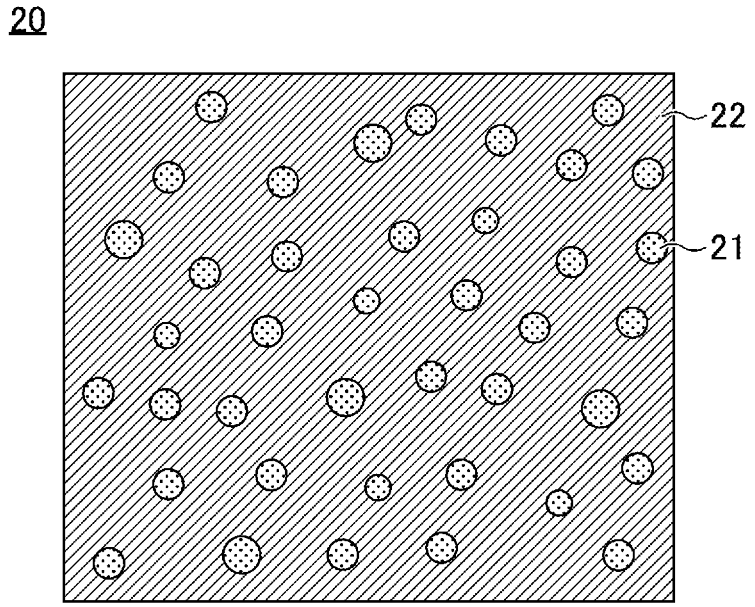
FIG. 2 is a schematic view of an electromagnetic wave absorbing particle dispersion liquid.

The electromagnetic wave absorbing particle dispersion liquid of the present embodiment can contain a liquid medium and the above-described electromagnetic wave absorbing particles contained in the liquid medium. That is, for example, as shown in FIG. 2, the electromagnetic wave absorbing particle dispersion liquid 20 of the present embodiment may contain the above-described electromagnetic wave absorbing particles 21 and a liquid medium 22. The electromagnetic wave absorbing particles 21 are preferably dispersed in the liquid medium 22.

FIG. 2 is a schematic view, and the electromagnetic wave absorbing particle dispersion liquid of the present embodiment is not limited to such a form. For example, although the electromagnetic wave absorbing particles 21 are illustrated as spherical particles in FIG. 2, the shape of the electromagnetic wave absorbing particles 21 is not limited to spherical particles, and the electromagnetic wave absorbing particles 21 may have any shape. The electromagnetic wave absorbing particle dispersion liquid 20 may contain other additives as necessary in addition to the electromagnetic wave absorbing particles 21 and the liquid medium 22.

The electromagnetic wave absorbing particle dispersion liquid of the present embodiment can be obtained using the above-described electromagnetic wave absorbing particles, in other words, using the electromagnetic wave absorbing particles obtained by the above-described method of producing electromagnetic wave absorbing particles.

The electromagnetic wave absorbing particle dispersion liquid may further contain dispersants and other additives if desired in addition to the electromagnetic wave absorbing particles and the liquid medium. The electromagnetic wave absorbing particle dispersion liquid can be used as an intermediate product of the electromagnetic wave absorbing particle dispersion or a coating liquid.

The liquid medium means a medium in a liquid state at a temperature at which the liquid medium is used, and is particularly preferably a medium in a liquid state at room temperature (27° C.). The liquid medium is not particularly limited and can be arbitrarily selected according to the application or the like, but as the liquid medium, one or more kinds selected from water, an organic solvent, a liquid plasticizer, an oil, and a compound which is polymerized by curing can be preferably used.

Hereinafter, the electromagnetic wave absorbing particle dispersion liquid of the present embodiment will be described in the order of (1) materials to be contained, (2) a method of producing the electromagnetic wave absorbing particle dispersion liquid, and (3) a method of using the electromagnetic wave absorbing particle dispersion liquid and an article using the electromagnetic wave absorbing particle dispersion liquid.

(1) Contained Materials (1-1) Electromagnetic Wave Absorbing Particles

The electromagnetic wave absorbing particle dispersion liquid of the present embodiment can contain the electromagnetic wave absorbing particles described above. Since the electromagnetic wave absorbing particles have already been described, the description thereof is omitted here.

(1-2) Liquid Medium (1-2-1) Organic Solvent

As the organic solvent used as the liquid medium, for example, one or more kinds selected from alcohols, ketones, esters, glycol derivatives, amides, aromatic hydrocarbons and the like can be used.

Specific examples thereof include alcohol-based materials such as methanol, ethanol, 1-propanol, isopropanol, butanol, pentanol, benzyl alcohol, diacetone alcohol, and the like; ketone-based materials such as acetone, methyl ethyl ketone, dimethyl ketone, methyl propyl ketone, methyl isobutyl ketone, cyclohexanone, isophorone, and the like; ester-based materials such as 3-methyl-methoxy-propionate, n-butyl acetate, and the like; glycol derivatives such as ethylene glycol monomethyl ether, ethylene glycol monoethyl ether, ethylene glycol isopropyl ether, propylene glycol monomethyl ether, propylene glycol monoethyl ether, propylene glycol monomethyl ether acetate, propylene glycol monoethyl ether acetate, and the like; amides such as formamide, N-methylformamide, dimethylformamide, dimethylacetamide, N-methyl-2-pyrrolidone, and the like; aromatic hydrocarbons such as toluene, xylene, and the like; ethylene chloride; chlorobenzene; and the like. One or more kinds of the above can be used as the organic solvent.

Among the above organic solvents, one or more solvents selected from dimethyl ketone, methyl ethyl ketone, methyl isobutyl ketone, toluene, propylene glycol monomethyl ether acetate, n-butyl acetate, and the like can be more preferably used.

(1-2-2) Oils

The oil used as the liquid medium is not particularly limited, but a vegetable oil or a compound derived from a vegetable oil can be preferably used.

As the vegetable oils, one or more kinds selected from drying oils such as linseed oil, sunflower oil, tong oil, perilla oil, and the like; semidrying oil such as sesame oil, cotton seed oil, rapeseed oil, soybean oil, rice bran oil, poppy oil, and the like; and non-drying oils such as olive oil, coconut oil, palm oil, dehydrated castor oil, and the like can be preferably used.

As the compound derived from a vegetable oil, one or more compounds selected from fatty acid monoesters obtained by a direct esterification reaction between a fatty acid of a vegetable oil and a monoalcohol, ethers, and the like can be preferably used.

Commercially available petroleum-based solvents can also be used as oils.

As commercially available petroleum-based solvents, ISOPAR (Registered Trademark) E, EXXSOL (Registered Trademark) (the same applies hereinafter) Hexane, Heptane, E, D30, D40, D60, D80, D95, D110, D130 (all manufactured by Exxon Mobil Corporation), and the like can be used.

(1-2-3) Liquid Plasticizer

Examples of the liquid plasticizer used as the liquid medium include one or more selected from a plasticizer which is a compound of a monohydric alcohol and an organic acid ester, an ester-based plasticizer such as a polyhydric alcohol organic acid ester compound and the like, and a phosphoric acid-based plasticizer such as an organic phosphoric acid-based plasticizer and the like. It is preferable that all of them are liquid at room temperature.

Among them, a plasticizer which is an ester compound synthesized from a polyhydric alcohol and a fatty acid can be preferably used. The ester compound synthesized from the polyhydric alcohol and the fatty acid is not particularly limited, and for example, a glycol-based ester compound obtained by a reaction between glycol and a monobasic organic acid can be suitably used. As the glycol, one or more kinds selected from triethylene glycol, tetraethylene glycol, tripropylene glycol, and the like can be preferably used. As the monobasic organic acid, one or more kinds selected from butyric acid, isobutyric acid, caproic acid, 2-ethylbutyric acid, heptylic acid, n-octylic acid, 2-ethylhexvlic acid, pelargonic acid (n-nonylic acid), decylic acid, and the like can be preferably used.

Ester compounds of tetraethylene glycol, tripropylene glycol and a monobasic organic compound can also be suitably used. Among them, one or more kinds selected from fatty acid esters of triethylene glycol such as triethylene glycol dihexanate, triethylene glycol di-2-ethylbutyrate, triethylene glycol di-octanate, triethylene glycol di-2-ethylhexanate, and the like can be preferably used. Furthermore, fatty acid esters of triethylene glycol can also be preferably used.

(1-2-4) Compound Polymerized by Curing

As the compound which is polymerized by curing and is used in the electromagnetic wave absorbing particle dispersion liquid of the present embodiment, a monomer or an oligomer which forms a polymer by a polymerization reaction or the like caused by heat, light, or water can be suitably used.

Specific examples of the compound to be polymerized by curing include a methyl methacrylate monomer, an acrylate monomer, a styrene resin monomer, and the like.

Two or more kinds of the liquid media described above can be used in combination. Further, if necessary, an acid or an alkali may be added to the liquid medium to adjust the pH.

(1-3) Dispersing Agents

In the electromagnetic wave absorbing particle dispersion liquid of the present embodiment, in order to further improve the dispersion stability of the electromagnetic wave absorbing particles and avoid coarsening of the particle diameter due to re-agglomeration, the electromagnetic wave absorbing particle dispersion liquid of the present embodiment may contain various dispersing agents, surfactants, coupling agents, and the like.

The dispersing agents, the coupling agents, and the surfactants can be selected in accordance with the application, but are preferably materials having one or more functional groups selected from an amine-containing group, a hydroxyl group, a carboxyl group, a phosphoric acid group, and an epoxy group. These functional groups are adsorbed on the surface of the electromagnetic wave absorbing particles to prevent agglomeration, and have an effect of uniformly dispersing the particles. A polymer-based dispersing agent having one or more kinds selected from these functional groups in the molecule can be more preferably used as the dispersing agent.

Preferred examples of commercially available dispersing agents include SOLSPERSE (Registered Trademark) (same applies hereinafter) 3000, 5000, 9000, 11200, 12000, 13000, 13240, 13650, 13940, 16000, 17000, 18000, 20000, 21000, 24000SC, 24000GR, 26000, 27000, 28000, 31845, 32000, 32500, 32550, 32600, 33000, 33500, 34750, 35100, 35200, 36600, 37500, 38500, 39000, 41000, 41090, 53095, 55000, 56000, 71000, 76500, J180, J200, M387, and the like manufactured by the Lubrizol Corporation; SOLPLUS (Registered Trademark) (same applies hereinafter) D510, D520, D530, D540, DP310, K500, L300, L400, R700, and the like; Disperbyk (Registered Trademark) (same applies hereinafter)—101, 102, 103, 106, 107, 108, 109, 110, 111, 112, 116, 130, 140, 142, 145, 154, 161, 162, 163, 164, 165, 166, 167, 168, 170, 171, 174, 180, 181, 182, 183, 184, 185, 190, 191, 192, 2000, 2001, 2009, 2020, 2025, 2050, 2070, 2095, 2096, 2150, 2151, 2152, 2155, 2163, 2164, Anti-Terra (Registered Trademark) (same applies hereinafter)—U, 203, 204, and the like, manufactured by BYK Japan KK; BYK (Registered Trademark) (same applies hereinafter)—P104, P104S, P105, P9050, P9051, P9060, P9065, P9080, 051, 052, 053, 054, 055, 057, 063, 065, 066N, 067A, 077, 088, 141, 220S, 300, 302, 306, 307, 310, 315, 320, 322, 323, 325, 330, 331, 333, 337, 340, 345, 346, 347, 348, 350, 354, 355, 358N, 361N, 370, 375, 377, 378, 380N, 381, 392, 410, 425, 430, 1752, 4510, 6919, 9076, 9077, W909, W935, W940, W961, W966, W969, W972, W980, W985, W995, W996, W9010, Dynwet800, Siclean3700, UV3500, UV3510, UV3570, and the like; EFKA (Registered Trademark) (same applies hereinafter) 2020, 2025, 3030, 3031, 3236, 4008, 4009, 4010, 4015, 4020, 4046, 4047, 4050, 4055, 4060, 4080, 4300, 4310, 4320, 4330, 4340, 4400, 4401, 4402, 4403, 4500, 5066, 5220, 6220, 6225, 6230, 6700, 6780, 6782, 7462, 8503, and the like, manufactured by EFKA; JONCRYL (Registered Trademark) (same applies hereinafter) 67, 678, 586, 611, 680, 682, 690, 819, –JDX5050, and the like, manufactured by BASF Japan; TERPLUS (Registered Trademark) (same applies hereinafter) MD1000, D 1180, D 1130, and the like, manufactured by Otsuka Chemical Co. Ltd; AJISPER (Registered Trademark) (same applies hereinafter) PB-711, PB-821, PB-822, and the like, manufactured by Ajinomoto Fine-Techno Co., Inc.; DISPARLON (Registered Trademark) (same applies hereinafter) 1751N, 1831, 1850, 1860, 1934, DA-400N, DA-703-50, DA-325, DA-375, DA-550, DA-705, DA-725, DA-1401, DA-7301, DN-900, NS-5210, NVI-8514L, and the like, manufactured by Kusumoto Chemicals Ltd.; ARUFON (Registered Trademark) (same applies hereinafter) UH-2170, UC-3000, UC-3910, UC-3920, UF-5022, UG-4010, UG-4035, UG-4040, UG-4070, RESEDA (Registered Trademark) (same applies hereinafter) GS-1015, GP-301, GP-301S, and the like, manufactured by TOAGOSEI Co., Ltd.; DIANAL (Registered Trademark) (same applies hereinafter) BR-50, BR-52, BR-60, BR-73, BR-77, BR80, BR-83, BR-85, BR-87, BR-88, BR-90, BR-96, BR-102, BR-113, BR-116, and the like, manufactured by Mitsubishi Chemical Corporation; and the like.

A liquid dispersing agent having a glass transition temperature lower than room temperature may be used instead of the liquid medium. That is, the electromagnetic wave absorbing particle dispersion liquid of the present embodiment may contain electromagnetic wave absorbing particles and a liquid dispersing agent, or may be composed of electromagnetic wave absorbing particles and a liquid dispersing agent. Preferred specific examples of commercially available liquid dispersing agents include SOLSPERSE (Registered Trademark) 20000, manufactured by The Lubrizol Corporation, Disparlon (Registered Trademark), manufactured by Kusumoto Chemicals Ltd. (the same applies hereinafter) DA234, DA325, DA375, and the like.

(1-4) Other Additives

The electromagnetic wave absorbing particle dispersion liquid of the present embodiment may contain additives such as various surfactants and resin components in order to control coating properties, leveling properties, and drying properties. When the additive is added, the electromagnetic wave absorbing particle dispersion liquid preferably contains the additive in a small amount within a range of 5% by mass or less of the dispersion liquid. Surfactants include anionic, cationic, nonionic, or amphoteric surfactants.

In addition, in order to impart flexibility to the electromagnetic wave absorbing particle dispersion obtained by using the electromagnetic wave absorbing particle dispersion liquid, the dispersion liquid may contain one or more organic resins selected from a silicone resin, an acrylic resin, a polyester resin, a polyurethane resin, a hydrophilic organic resin containing a polyoxyalkylene group, an epoxy resin, and the like. When the organic resin is added, the electromagnetic wave absorbing particle dispersion liquid preferably contains a small amount of the organic resin in a range of 5% by mass or less of the electromagnetic wave absorbing particle dispersion.

In addition, in order to impart crack prevention properties to the electromagnetic wave absorbing particle dispersion prepared by using the electromagnetic wave absorbing particle dispersion liquid, the electromagnetic wave absorbing particle dispersion liquid may contain one or more resins selected from a thermosetting resin, a thermoplastic resin, an ultraviolet curable resin, and the like. When the resin is added, the electromagnetic wave absorbing particle dispersion liquid preferably contains the resin in a range of 20% by mass or less of the dispersion liquid. More specific examples of the resin include acrylic resins, epoxy resins, polyester resins, amino resins, urethane resins, furan resins, silicone resins, and modified products of these resins.

(2) Method of Producing Electromagnetic Wave Absorbing Particle Dispersion Liquid The method of producing the electromagnetic wave absorbing particle dispersion liquid of the present embodiment is not particularly limited. The electromagnetic wave absorbing particle dispersion liquid of the present embodiment can be prepared by adding and dispersing, for example, the above-described electromagnetic wave absorbing particles and, if necessary, a dispersing agent, and other additives in the above-described liquid medium. As described above, a liquid dispersant may be used in place of the liquid medium.

The method of dispersing the electromagnetic wave absorbing particles and the like in the liquid medium is not particularly limited, and examples thereof include a pulverization/dispersion treatment method using an apparatus such as a bead mill, a ball mill, a sand mill, a paint shaker, an ultrasonic homogenizer, or the like. Among them, media stirring mills such as bead mills, ball mills, sand mills, and paint shakers using media such as beads, balls, and ottawa sand can be suitably used because the electromagnetic wave-absorbing particles can be made to have a desired particle size in a short time.

When the pulverization/dispersion treatment using the medium stirring mill is used, the dispersion of electromagnetic wave absorbing particles into the liquid medium is accompanied by the progress of fine particle formation due to the collision of the electromagnetic wave absorbing particles with each other and the collision of the medium with the electromagnetic wave absorbing particles, so that the electromagnetic wave absorbing particles can be further atomized and dispersed. That is, pulverization/dispersion treatment is performed.

The dispersion concentration of the electromagnetic wave absorbing particles in the electromagnetic wave absorbing particle dispersion liquid is preferably 0.01% by mass or more and 80% by mass or less. This is because sufficient electromagnetic wave absorption characteristics can be exhibited by setting the content of the electromagnetic wave absorbing particles to 0.01% by mass or more. Further, when the content of the electromagnetic wave absorbing particles is 80% by mass or less, the electromagnetic wave absorbing particles can be uniformly dispersed in the liquid medium.

In the electromagnetic wave absorbing particles dispersion liquid of the present embodiment, when a combination of the liquid medium, the dispersing agent, the coupling agent, and the surfactant are selected, the electromagnetic wave absorbing particle dispersion according to the exemplary embodiment does not cause gelation of the dispersion liquid or precipitation of the particles for 6 months or more even when the dispersion is placed in a thermostatic bath at a temperature of 40° C., for example, and thus an increase in the particle diameter can be suppressed.

(3) Method of Using Electromagnetic Wave Absorbing Particle Dispersion Liquid, and Article Using Electromagnetic Wave Absorbing Particle Dispersion Liquid The application or the like of the electromagnetic wave absorbing particle dispersion liquid of the present embodiment is not particularly limited, and the electromagnetic wave absorbing particle dispersion liquid can be used for various applications.

For example, the electromagnetic wave absorbing particle dispersion liquid of the present embodiment can be used for an electromagnetic wave absorbing substrate by forming a dispersion film by applying the dispersion liquid to the surface of an appropriate substrate. The dispersion film is a kind of the electromagnetic wave absorbing particle dispersion and a kind of a dried and solidified product of the electromagnetic wave absorbing particle dispersion liquid.

In addition, the electromagnetic wave absorbing particle dispersion liquid of the present embodiment is dried, and a pulverization treatment is performed as necessary to obtain a powdered electromagnetic wave absorbing particle dispersion (in the present specification, also referred to as "a powdery dispersion"). That is, the powdery dispersion is a kind of the electromagnetic wave absorbing particle dispersion and a kind of the dried and solidified product of the electromagnetic wave absorbing particle dispersion liquid. The powdery dispersion is a powdery dispersion in which electromagnetic wave absorbing particles are dispersed in a solid medium such as a dispersant or the like. Since the powdery dispersion contains a dispersing agent, it is possible to easily redisperse the electromagnetic wave absorbing particles in a medium by mixing the powdery dispersion with an appropriate medium.

The powdery dispersion can also be used for a raw material for adding the electromagnetic wave absorbing particles in a dispersed state to an electromagnetic wave absorbing product. That is, the powdery dispersion in which the electromagnetic wave absorbing particles of the present embodiment are dispersed in a solid medium may be dispersed again in a liquid medium to be used as a dispersion liquid for an infrared absorbing product, or the powdery dispersion may be kneaded into a resin to be used as an electromagnetic wave absorbing particle dispersion as described below.

The electromagnetic wave absorbing particle dispersion liquid of the present embodiment can be used for various applications using photothermal conversion.

For example, a curable ink composition can be obtained by adding the electromagnetic wave absorbing particle dispersion liquid to an uncured thermosetting resin or adding the uncured thermosetting resin to the electromagnetic wave absorbing particle dispersion liquid. The curable ink composition contains the above-described electromagnetic wave absorbing particles, and the electromagnetic wave absorbing particles function as an auxiliary agent for increasing the amount of heat generated by irradiation with electromagnetic waves such as infrared rays. Since the curable ink composition contains a thermosetting resin, when the curable ink composition is irradiated with electromagnetic waves such as infrared rays, the electromagnetic wave absorbing particles function as an auxiliary agent for increasing the amount of heat generated as described above, and the thermosetting resin can be cured. If the curable ink composition is provided on, for example, a substrate, the adhesion between a cured product of the curable ink composition and the substrate can be enhanced upon irradiating electromagnetic waves such as infrared rays.

Therefore, in addition to the use as conventional ink, the curable ink composition can be suitably used in an optical modeling method, in which a three-dimensional object is formed by repeatedly coating the curable ink composition and curing the composition by irradiating with electromagnetic waves such as infrared rays, to build an object.

In addition, a thermoplastic resin-containing ink composition can be obtained by adding the electromagnetic wave absorbing particles of the present embodiment to a heat-melted thermoplastic resin, or by dispersing the electromagnetic wave absorbing particles of the present embodiment in an appropriate solvent and then adding a thermoplastic resin having high solubility in the solvent.

When the thermoplastic resin-containing ink composition is provided on, for example, a substrate and irradiated with electromagnetic waves such as infrared rays, a cured product of the thermoplastic resin-containing ink composition can be adhered to the substrate by removing the solvent and heat-fusing the resin. In this case, also in the thermoplastic resin-containing ink composition, the electromagnetic wave absorbing particles function as an auxiliary agent for increasing the amount of heat generated by irradiation with electromagnetic waves such as infrared rays, as in the case of the curable ink composition.

Therefore, in addition to the use as conventional ink, the thermoplastic resin-containing ink composition can be suitably used in an optical modeling method, in which a three-dimensional object is formed by repeatedly coating the thermoplastic resin-containing ink composition, removing the solvent by irradiating with electromagnetic waves such as infrared rays, and heat-fusing the resin, to build an object.

The curable ink composition or the thermoplastic resin-containing ink composition described above is also an example of the electromagnetic wave absorbing particle dispersion liquid of the present embodiment.

[4] Electromagnetic Wave Absorbing Particle Dispersion

Next, the electromagnetic wave absorbing particle dispersion of the present embodiment will be described.

Figure 3:
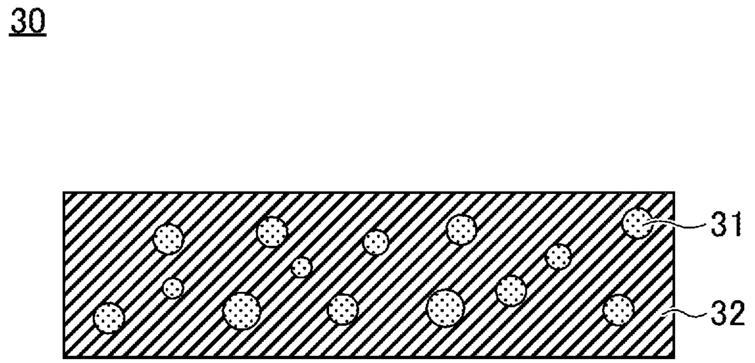
FIG. 3 is a schematic view of an electromagnetic wave absorbing particle dispersion.

The electromagnetic wave absorbing particle dispersion of the present embodiment can contain a solid medium and the above-described electromagnetic wave absorbing particles contained in the solid medium. Specifically, for example, as schematically illustrated in FIG. 3, an electromagnetic wave absorbing particle dispersion 30 may include the above-described electromagnetic wave absorbing particles 31 and a solid medium 32. The electromagnetic wave absorbing particles 31 may be disposed in the solid medium 32. The electromagnetic wave absorbing particles 31 are preferably dispersed in the solid medium 32. It should be noted that FIG. 3 is a schematic view, and the electromagnetic wave absorbing particle dispersion of the present embodiment is not limited to this form. For example, in FIG. 3, the electromagnetic wave absorbing particles 31 are indicated as spherical particles, but the shape of the electromagnetic wave absorbing particles 31 is not limited to such a form. The electromagnetic wave absorbing particles 31 may have any shape. Other additives may be included in the electromagnetic wave absorbing particle dispersion 30, as needed, in addition to the electromagnetic wave absorbing particles 31 and the solid medium 32.

The solid medium means a medium that is solid at the temperature at which it is used, and is particularly preferably a medium that is solid at room temperature (27° C.). As the solid medium, a resin, glass or the like can be used.

As the solid medium, a resin can be particularly suitably used from the viewpoint of ease of handling and the like.

When a resin is used as the solid medium, the type of the resin is not particularly limited. Examples of the resin include one type of resin selected from the group consisting of polyester resins, polycarbonate resins, acrylic resins, styrene resins, polyimide resins, polyethylene resins, vinyl chloride resins, olefin resins, epoxy resins, polyimide resins, fluorine resins, ethylene-vinyl acetate copolymers, polyvinyl acetal resins, and ultraviolet curable resins, or a mixture of two or more types of resins selected from the group.

The content ratio of the electromagnetic wave absorbing particles in the electromagnetic wave absorbing particle dispersion is not particularly limited. The electromagnetic wave absorbing particle dispersion preferably contains the electromagnetic wave absorbing particles at a ratio of 0.001% by mass or more and 80% by mass or less. This is because when the electromagnetic wave absorbing particles are contained in an amount of 0.001% by mass or more, a sufficient infrared shielding function can be exhibited. In addition, when the content ratio of the electromagnetic wave absorbing particles is 80% by mass or less, it is possible to prevent the electromagnetic wave absorbing particles from being granulated in the solid medium, and thereby being able to maintain particularly good transparency. In addition, the amount of the electromagnetic wave absorbing particles used can be reduced, which is advantageous in terms of cost. Furthermore, when the content ratio of the electromagnetic wave absorbing particles is 80% by mass or less, the ratio of the solid medium contained in the electromagnetic wave absorbing particle dispersion can be increased, and the strength of the dispersion can be increased.

The shape and the like of the electromagnetic wave absorbing particle dispersion of the present embodiment are not particularly limited, and can be arbitrarily selected according to the application or the like. For example, the electromagnetic wave absorbing particle dispersion of the present embodiment preferably has any one of a sheet shape, a board shape, and a film shape.

The electromagnetic wave absorbing particle dispersion of the present embodiment will be described in the order of (1) a method of producing the electromagnetic wave absorbing particle dispersion, (2) an electromagnetic wave absorbing substrate, and (3) a method of using the electromagnetic wave absorbing particle dispersion and an article using the same.

(1) Method of Producing Electromagnetic Wave Absorbing Particle Dispersion

The method of producing the electromagnetic wave absorbing particle dispersion is not particularly limited. The electromagnetic wave absorbing particle dispersion can be produced by, for example, kneading the above-described electromagnetic wave absorbing particles into a solid medium such as a resin and molding the kneaded product into a desired shape such as a film or a board.

The electromagnetic wave absorbing particle dispersion can also be produced by mixing the above-described electromagnetic wave absorbing particle dispersion with a solid medium such as a resin. In addition, the electromagnetic wave absorbing particle dispersion can be produced by adding a powdery dispersion in which the electromagnetic wave absorbing particles are dispersed in a solid medium, that is, the above-described powdery dispersion is added to a liquid medium and mixed with the solid medium such as a resin.

The shape of the electromagnetic wave absorbing particle dispersion of the present embodiment is not particularly limited. For example, when a resin is used as a solid medium, the shape of the electromagnetic wave absorbing particle dispersion may have a sheet shape, a board shape, or a film shape with thicknesses of 0.1 μm or more and 50 mm or less.

As described above, when the electromagnetic wave absorbing particles are kneaded into a solid medium such as a resin to prepare an electromagnetic wave absorbing particle dispersion, the electromagnetic wave absorbing particles and the solid medium are heated, mixed, and kneaded at a temperature (for example, about 200° C. or higher and 300° C. or lower) near the melting point of the solid medium such as a resin.

Although the material obtained by kneading the electromagnetic wave absorbing particles into the solid medium can be molded into a desired shape, it is also possible to once pelletize the material and mold the pellet into a desired shape such as a film or a board by appropriate method.

The molding method is not particularly limited, and for example, an extrusion molding method, an inflation molding method, a solution casting method, a casting method or the like can be used.

As described above, when the electromagnetic wave absorbing particle dispersion is formed into a sheet shape, a board shape, or a film shape, the thickness thereof is not particularly limited and may be selected depending on the application or the like.

In addition, the amount of the filler with respect to the solid medium in the electromagnetic wave absorbing particle dispersion, that is, the blending amount of the electromagnetic wave absorbing particles can be arbitrarily selected in accordance with the thickness of the electromagnetic wave absorbing particle dispersion, the optical and the mechanical characteristics required for the electromagnetic wave absorbing particle dispersion, and the like. For example, in general, the amount of the filler is preferably 80% by mass or less with respect to the solid medium such as a resin.

When the amount of the filler with respect to the solid medium is 80% by mass or less, granulation of the electromagnetic wave absorbing particles in the solid medium can be suppressed, and thus particularly good transparency can be maintained. In addition, the amount of the electromagnetic wave absorbing particles used can be reduced, which is advantageous in terms of cost.

The lower limit of the amount of the filler with respect to the solid medium is not particularly limited, but is preferably, for example, 0.001% by mass or more from the viewpoint that the electromagnetic wave absorbing particle dispersion exhibits a sufficient infrared shielding function.

As the electromagnetic wave absorbing particle dispersion, an electromagnetic wave absorbing particle dispersion in which electromagnetic wave absorbing particles are dispersed in a solid medium may be further pulverized to be used in a powder state. When this configuration is adopted, the electromagnetic wave absorbing particles are sufficiently dispersed in the solid medium in the powdered electromagnetic wave absorbing particle dispersion. Therefore, a liquid or solid electromagnetic wave absorbing particle dispersion can be easily produced by dissolving the powdery electromagnetic wave absorbing particle dispersion as a so-called master batch in an appropriate liquid medium or kneading the master batch with resin pellets or the like.

The solid medium serving as the matrix of the sheet, board, or film described above is not particularly limited and can be selected in accordance with the application. As described above, a resin can be suitably used from the viewpoint of handleability. When a resin is used as the solid medium, one type of resin selected from the group consisting of polyester resins, polycarbonate resins, acrylic resins, styrene resins, polyamide resins, polyethylene resins, vinyl chloride resins, olefin resins, epoxy resins, polyimide resins, fluorine resins, ethylene-vinyl acetate copolymers, polyvinyl acetal resins, and ultraviolet curable resins, or a mixture of two or more types of resins selected from the group of resins can be suitably used. In particular, one or more resins selected from a polyethylene terephthalate resin, an acrylic resin, a polyamide resin, a vinyl chloride resin, a polycarbonate resin, an olefin resin, an epoxy resin, a polyimide resin, and the like can be suitably used as a low-cost resin having high transparency and wide versatility. In consideration of weather resistance, a fluororesin may also be used.

(2) Electromagnetic Wave Absorbing Substrate

Figure 4:
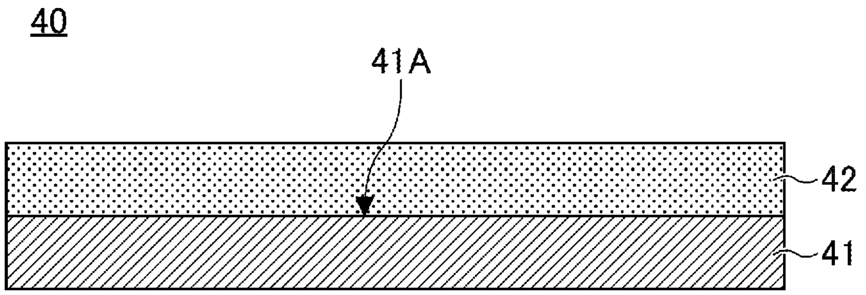
FIG. 4 is a schematic view of an electromagnetic wave absorbing substrate.

The electromagnetic wave absorbing particle dispersion of the present embodiment includes an embodiment of an electromagnetic wave absorbing substrate having a substrate and a dispersion film containing the above-described electromagnetic wave absorbing particles disposed on a surface of the substrate. Specifically, as illustrated in FIG. 4 which is a schematic cross-sectional view taken along the direction where the substrate and the dispersion film are laminated, an electromagnetic wave absorbing substrate 40 can have a substrate 41 and a dispersion film 42 containing electromagnetic wave absorbing particles. The dispersion film 42 containing the electromagnetic wave absorbing particles can be disposed on at least one surface 41A of the substrate 41.

Such an electromagnetic wave absorbing substrate can be produced, for example, by the following procedure.

An electromagnetic wave absorbing particle dispersion liquid is prepared by mixing the above-described electromagnetic wave absorbing particles, an organic solvent such as alcohol, a liquid medium such as water, a resin binder, and optionally a dispersing agent (a dispersion liquid preparation step).

Next, the electromagnetic wave absorbing particle dispersion liquid is applied to the surface of an appropriate substrate (an application step).

The liquid medium is removed or the resin binder is cured to obtain an electromagnetic wave absorbing particle dispersion (a dispersion preparation step). It should be noted that both removal of the liquid medium and curing of the resin binder can be performed.

Through the above steps, the electromagnetic wave absorbing substrate in which the electromagnetic wave absorbing particle dispersion is directly laminated on the surface of the substrate is obtained.

The resin binder can be selected according to the application, and examples thereof include an ultraviolet curable resin, a thermosetting resin, an ambient temperature curable resin, a thermoplastic resin, and the like.

On the other hand, the electromagnetic wave absorbing particle dispersion liquid that does not contain a resin binder is coated on a substrate, and the electromagnetic wave absorbing particle dispersion may be laminated on the surface of the substrate. In addition, after the electromagnetic wave absorbing particle dispersion liquid that does not contain the resin binder is coated on a substrate, a liquid medium containing a binder component may be applied on the layer of the electromagnetic wave absorbing particle dispersion.

Therefore, in the method of producing an electromagnetic wave absorbing substrate, specifically, first, for example, a liquid electromagnetic wave absorbing particle dispersion liquid in which electromagnetic wave absorbing particles are dispersed in at least one liquid medium selected from an organic solvent, an organic solvent in which a resin is dissolved, an organic solvent in which a resin is dispersed, and water can be applied to the surface of the substrate. Then, the obtained coating film is solidified by an appropriate method to obtain an electromagnetic wave absorbing substrate.

As the resin, for example, a resin binder can be used, and as described above, the liquid electromagnetic wave absorbing particle dispersion liquid containing the resin binder is applied to the surface of the substrate, and an obtained coating film is solidified by an appropriate method to obtain an electromagnetic wave absorbing substrate.

The electromagnetic wave absorbing substrate can also be obtained by applying a liquid electromagnetic wave absorbing particle dispersion liquid obtained by mixing an electromagnetic wave absorbing particle dispersion in which electromagnetic wave absorbing particles are dispersed in a powdery solid medium with a predetermined medium to the surface of the substrate, and solidifying the obtained coating film by an appropriate method.

Among the liquid electromagnetic wave absorbing particle dispersion liquids, the electromagnetic wave absorbing particle dispersion liquid in which two or more kinds of solid media or the like are added and mixed to the surface of the substrate, and the obtained coating film is solidified by an appropriate method, thereby forming an electromagnetic wave absorbing substrate, is of course also possible.

The material of the substrate used for the electromagnetic wave absorbing substrate is not particularly limited as long as the material is a transparent body, and one or more kinds selected from glass, a resin sheet, a resin board, a resin film, and the like are preferably used. The transparent body is a material that transmits light in the visible light region, and the degree of transmission of light in the visible light region can be arbitrarily selected according to the application of the electromagnetic wave absorbing substrate or the like.

The resin used for the resin sheet, resin board, and resin film is not particularly limited, and can be selected according to the required characteristics such as the surface state and durability of the sheet, board, and film. Examples of the resin include polyester polymers such as polyethylene terephthalate, polyethylene naphthalate, and the like; cellulose polymers such as diacetyl cellulose, triacetyl cellulose, and the like; acrylic polymers such as polycarbonate polymers, polymethyl methacrylate, and the like; styrene polymers such as polystyrene, acrylonitrile-styrene copolymer, and the like; olefin polymers such as polyethylene, polypropylene, cyclic or norbornene polyolefin, ethylene-propylene copolymer, and the like; amide polymers such as vinyl chloride polymers, aromatic polyamide, and the like; imide polymers; sulfone polymers; polyether sulfone polymers; polyether ether ketone polymers; polyphenylene sulfide polymers; vinyl alcohol polymers; vinylidene chloride polymers; vinyl butyral polymers; arylate polymers; polyoxymethylene polymers; epoxy polymers; and transparent polymers such as binary copolymers, ternary copolymers, graft copolymers, and blends thereof. In particular, biaxially oriented polyester films such as polyethylene terephthalate, polybutylene terephthalate, polyethylene-2,6-naphthalate, and the like are preferably used from the viewpoints of mechanical characteristics, optical characteristics, heat resistance, and economical efficiency. The biaxially oriented polyester film may be a copolyester film.

(3) Method of Using Electromagnetic Wave Absorbing Particle Dispersion and Article Using the Same The electromagnetic wave absorbing particle dispersion and the electromagnetic wave absorbing substrate of the present embodiment described above can transmit light in the visible light region and block light in the infrared region. Therefore, for example, in various buildings and vehicles, the electromagnetic wave absorbing particle dispersion and the electromagnetic wave absorbing substrate of the present embodiment described above can be used as a window material or the like for the purpose of shielding light in the infrared region while sufficiently taking in visible light and suppressing an increase in indoor temperature while maintaining brightness. In addition, the electromagnetic wave absorbing particle dispersion and the electromagnetic wave absorbing substrate of the present embodiment described above can be suitably used as a filter and the like for shielding infrared rays radiated forward from a plasma display panel (PDP).

In addition, since the electromagnetic wave absorbing particles of the present embodiment have absorption in an infrared region, when an infrared laser is irradiated to a printing surface including the electromagnetic wave absorbing particles, infrared light having a specific wavelength is absorbed. Therefore, an anti-counterfeit printed matter obtained by printing the anti-counterfeit ink containing the electromagnetic wave absorbing particles on one side or both sides of a substrate to be printed is irradiated with infrared rays having a specific wavelength, and its reflection or transmission is read, whereby the authenticity of the printed matter can be determined from the difference in the amount of reflection or transmission. The anti-counterfeit printed matter is an example of the electromagnetic wave absorbing particle dispersion of the present embodiment.

In addition, the photothermal conversion layer can be formed by applying an ink obtained by mixing the above-described electromagnetic wave absorbing particle dispersion liquid and a binder component onto a substrate, drying the applied ink, and then curing the dried ink. The photothermal conversion layer generates heat in a portion irradiated with an electromagnetic wave laser such as an infrared ray, and can heat an adjacent material. Therefore, the photothermal conversion layer can generate heat only at a desired position with high positional accuracy by irradiation with an electromagnetic wave laser such as infrared light. For this reason, the photothermal conversion layer can be applied as a local heating medium in a wide range of fields such as electronics, medicine, agriculture, machinery, or the like. The material including the photothermal conversion layer can be suitably used as, for example, a donor sheet used when forming an organic electroluminescent element by a laser transfer method, a thermal paper for a thermal printer, or an ink ribbon for a thermal transfer printer. The photothermal conversion layer is an example of the electromagnetic wave absorbing particle dispersion of the present embodiment.

In addition, an infrared absorbing fiber can be obtained by dispersing the above-described electromagnetic wave absorbing particles in an appropriate medium and allowing the dispersion to be contained at one or more positions selected from the sur face and the inside of the fiber. Since the Infrared absorbing fiber contains the electromagnetic wave absorbing particles, the infrared absorbing fiber efficiently absorbs near infrared rays or the like from sunlight or the like and has excellent heat retaining properties. Since the infrared absorbing fiber transmits light in the visible light region, the infrared absorbing fiber is excellent in design.

As a result, the infrared absorbing fiber can be used in various applications including textile products such as cold-proof clothing, sports clothing, stockings, curtains, and the like, and other industrial textile products, which require heat-retaining properties. The infrared absorbing fiber is an example of the electromagnetic wave absorbing particle dispersion of the present embodiment.

In addition, the electromagnetic wave absorbing particle dispersion of the present embodiment can be applied to materials such as a roof and an outer wall material of an agricultural and horticultural house. Since the electromagnetic wave absorbing particle dispersion of the present embodiment transmits visible light, light necessary for photosynthesis of plants in an agricultural and horticultural house can be secured. Since the electromagnetic wave absorbing particles of the present embodiment can efficiently absorb light such as near infrared light included in sunlight other than visible light, the electromagnetic wave absorbing particle dispersion of the present embodiment can be used as a heat insulating material for agricultural and horticultural facilities having heat insulating properties. The heat insulating material for agricultural and horticultural facilities is an example of the electromagnetic wave absorbing particle dispersion of the present embodiment.

[5] Electromagnetic Wave Absorbing Laminate

The electromagnetic wave absorbing laminate of the present embodiment may have a laminated structure including the above-described electromagnetic wave absorption particle dispersion and a transparent substrate. Examples of the electromagnetic wave absorbing laminate include an example in which two or more transparent substrates and the above-described electromagnetic wave absorbing particle dispersion are laminated. In this case, the electromagnetic wave absorbing particle dispersion can be disposed, for example, between transparent substrates and used as an electromagnetic wave absorbing intermediate film.

Figure 5:
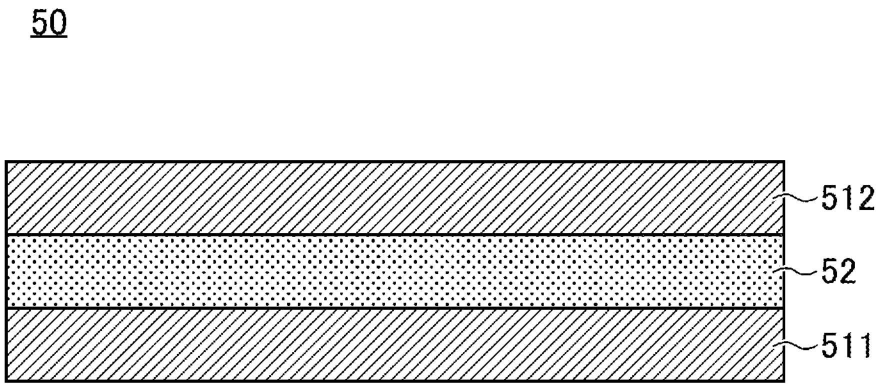
FIG. 5 is a schematic view of an electromagnetic wave absorbing laminate.

In this case, specifically, as illustrated in FIG. 5 which is a schematic cross-sectional view taken along the direction where transparent substrates and the electromagnetic wave absorbing particle dispersion are laminated, an electromagnetic wave absorbing laminate 50 can have a plurality of transparent substrates 511 and 512 and an electromagnetic wave absorbing particle dispersion 52. The electromagnetic wave absorbing particle dispersion 52 may be disposed between a plurality of transparent substrates 511 and 512. Although FIG. 5 illustrates an example in which two transparent substrates 511 and 512 are provided, the present invention is not limited to such an embodiment.

In this case, the electromagnetic wave absorbing intermediate film preferably has any one of a sheet shape, a board shape, and a film shape.

As the transparent substrate, one or more kinds selected from plate glass, plate-like plastic, film-like plastic, and the like that are transparent in the visible light region can be suitably used. It should be noted that the transparent substrate being transparent in the visible light region means a substrate that transmits light in the visible light region. The degree of transmission of light in the visible light region of the transparent substrate can be arbitrarily selected depending on the application of the electromagnetic wave absorbing laminate.

When a plastic is used as the transparent substrate, the material of the plastic is not particularly limited and can be selected according to the application. Examples of the materials of plastic include one or more selected from polycarbonate resins, acrylic resins, polyester resins, polyamide resins, vinyl chloride resins, olefin resins, epoxy resins, polyimide resins, ionomer resins, fluorine resins, and the like. As the polyester resin, a polyethylene terephthalate resin can be suitably used.

The transparent substrate may contain particles having an electromagnetic wave absorbing function. As the particles having an electromagnetic wave absorbing function, for example, the above-described electromagnetic wave absorbing particles can be used.

When the above-described electromagnetic wave absorbing particle dispersion is used as a constituting member of the intermediate layer sandwiched between a plurality of transparent substrates, a solar radiation shielding laminated structure, which is a kind of electromagnetic wave absorbing laminate which transmits visible light and has an electromagnetic wave absorbing function, can be obtained.

A plurality of transparent substrates facing each other with the electromagnetic wave absorbing particle dispersion interposed therebetween may be adhered and integrated by a known method to obtain the electromagnetic wave absorbing laminate described above.

When the above-described electromagnetic wave absorbing particle dispersion is used as an electromagnetic wave absorbing intermediate film, as the solid medium, those described in the electromagnetic wave absorbing particle dispersion can be used. However, from the viewpoint of enhancing the adhesion strength between the electromagnetic wave absorbing intermediate film and the transparent substrates, the solid medium is preferably a polyvinyl acetal resin.

The electromagnetic wave absorbing intermediate film can be produced by the above-described method of producing the electromagnetic wave absorbing particle dispersion, and can be, for example, the electromagnetic wave absorbing intermediate film having any one of a sheet shape, a board shape, and a film shape.

When the electromagnetic wave absorbing intermediate film does not have sufficient flexibility and adhesion to the transparent substrates, a liquid plasticizer for a medium resin is preferably used. For example, when the medium resin, which is a solid medium used in the electromagnetic wave absorbing intermediate film, is a polyvinyl acetal resin, the addition of a liquid plasticizer for a polyacetal resin is beneficial for improving adhesion to the transparent substrates.

As the plasticizer, a substance used as a plasticizer for the medium resin can be used. Examples of the plasticizer used for the infrared shielding film formed of a polyvinyl acetal resin include a plasticizer which is a compound of a monohydric alcohol and an organic acid ester, an ester-based plasticizer such as a polyhydric alcohol organic acid ester compound, and a phosphoric acid-based plasticizer such as an organic phosphoric acid-based plasticizer. Any plasticizer is preferably liquid at room temperature. Among them, a plasticizer which is an ester compound synthesized from a polyhydric alcohol and a fatty acid is preferably used.

At least one selected from the group consisting of a silane coupling agent, a metal salt of carboxylic acid, a metal hydroxide, and a metal carbonate may also be added to the electromagnetic wave absorbing intermediate film. The metal constituting the metal salt of carboxylic acid, the metal hydroxide, and the metal carbonate is not particularly limited, but is preferably at least one selected from sodium, potassium, magnesium, calcium, manganese, cesium, lithium, rubidium, and zinc. In the intermediate film for electromagnetic wave absorption, the content of at least one selected from the group consisting of a metal salt of a carboxylic acid, a metal hydroxide, and a metal carbonate is preferably 1% by mass or more and 100% by mass or less with respect to the electromagnetic wave absorbing particles.

Further, the intermediate film for electromagnetic wave absorption may contain at least one kind of particles among oxide particles, composite oxide particles, and boride particles containing one kind or two or more kinds of elements selected from the group consisting of Sb, V, Nb, Ta, W, Zr, F, Zn, Al, Ti, Pb, Ga, Re, Ru, P, Ge, In, Sn, La, Ce, Pr, Nd, Gd, Tb, Dy, Ho, Y, Sm, Eu, Er, Tm, Lu, Sr, and Ca in addition to the above-described electromagnetic wave absorbing particles as necessary. The intermediate film for electromagnetic wave absorption can contain the particles in a range of 5% by mass or more and 95% by mass or less when the total of the particles and the electromagnetic wave absorbing particles is 100% by mass.

In the electromagnetic wave absorbing laminate, at least one layer of the intermediate film disposed between the transparent substrates may contain an ultraviolet absorber. Examples of the ultraviolet absorber include one or more selected from a compound having a malonic acid ester structure, a compound having an oxalic acid anilide structure, a compound having a benzotriazole structure, a compound having a benzophenone structure, a compound having a triazine structure, a compound having a benzoate structure, a compound having a hindered amine structure, and the like.

The intermediate layer of the electromagnetic wave absorbing laminate may be composed of only the electromagnetic wave absorbing intermediate film.

The intermediate film for electromagnetic wave absorption described here is also an example of an electromagnetic wave absorbing particle dispersion. In addition, the electromagnetic wave absorbing laminate of the present embodiment is not limited to the form in which the electromagnetic wave absorbing particle dispersion is disposed between the transparent substrates as described above. Any configuration can be adopted as long as the electromagnetic wave absorbing laminate has a laminated structure including the electromagnetic wave absorbing particle dispersion and the transparent substrate.

EXAMPLES

Hereinafter, the present invention will be described more specifically with reference to Examples, but the present invention is not limited thereto.

(Evaluation Method)

First, evaluation methods in the following Examples and Reference Examples will be described.

(Cumulative 50% Particle Diameter, 95% Cumulative Particle Diameter)

The particle size distribution of the electromagnetic wave absorbing particles in Examples and Reference Examples was measured by a particle size distribution measuring apparatus (UPA-150, manufactured by Nikkiso Co., Ltd.)

based on a dynamic light scattering method for analysis by a frequency analysis method. As measurement conditions, the particle refractive index was 1.81, and the particle shape was non-spherical. The background was measured with methyl isobutyl ketone, and the refractive index of the solvent was 1.40. Then, a cumulative 50% particle diameter and a cumulative 95% particle diameter were obtained from the obtained particle size distribution.

(Crystal Structure, Lattice Constant)

The electromagnetic wave absorbing particles obtained by removing the solvent from the electromagnetic wave absorbing particle dispersion liquid were used to measure the crystal structure and the lattice constant of the composite oxide contained in the electromagnetic wave absorbing particles.

In the measurement of the crystal structure and the lattice constant of the composite oxide, the X-ray diffraction pattern of the electromagnetic wave absorbing particles was measured by a powder X-ray diffraction method (θ-2θ method) using a powder X-ray diffractometer (X'Pert-PRO/MPD, manufactured by PANalytical Spectris Co., Ltd.). The crystal structure of the composite oxide contained in the particles was specified from the obtained X-ray diffraction pattern, and the lattice constant was calculated by Rietveld analysis. An external standard method was employed for the Rietveld analysis. Rietveld analysis of the X-ray diffraction pattern of the Si standard powder (NIST640c) measured at the same time was first performed, and the zero-shift value and the half-width parameter obtained at that time were determined as the apparatus parameters to refine the Rietveld analysis of the target electromagnetic wave absorbing particles.

(Optical Characteristics of Dispersion Liquid)

The optical characteristics of the electromagnetic wave absorbing particle dispersion liquids in Examples and Reference Examples were measured as follows. First, the electromagnetic wave absorbing particle dispersion liquid was diluted with methyl isobutyl ketone as a solvent in a glass cell for measurement of a spectrophotometer. At this time, the dilution ratio was set so that the visible light transmittance after the dilution was 70%. Next, a transmitted light profile was measured with a spectrophotometer (UH4150, manufactured by Hitachi High-Tech Corporation) at intervals of 5 nm in a range of wavelengths from 200 nm to 2600 nm, and a visible light transmittance and a solar radiation transmittance were calculated in a range of wavelengths from 300 nm to 2100 nm based on JIS R 3106 (2019). At this time, in the measurement, the incident direction of light of the spectrophotometer was a direction perpendicular to the glass cell for measurement. In addition, a blank solution containing only methyl isobutyl ketone as a solvent in the glass cell for measurement was used as a base line of light transmittance.

(Optical Characteristics of Electromagnetic Wave Absorbing Substrate)

The optical characteristics of the electromagnetic wave absorbing substrates in Examples and Reference Examples were measured with a spectrophotometer (UH4150, manufactured by Hitachi High-Tech Corporation). The transmitted light profile was measured at intervals of 5 nm in the range of 200 nm to 2600 nm, and the visible light transmittance and the solar radiation transmittance were calculated in the range of 300 nm to 2100 nm based on JIS R 3106 (2019).

The optical characteristics of the electromagnetic wave absorbing substrate were evaluated after the production of the electromagnetic wave absorbing substrate and after the electromagnetic wave absorbing substrate was irradiated with ultraviolet rays for 20 minutes by a UV conveyor device (ECS-401GX, manufactured by Eye Graphic Co., Ltd.). At this time, a mercury vapor lamp having a dominant wavelength in 365 nm was used as a UV source in the UV conveyor device, and the UV irradiation intensity was 100 $mW/cm^2$. Therefore, in each Example and Reference Example, two samples were produced under the same conditions in order to evaluate the optical characteristics. In Table 2, "initial" is the result of evaluation performed after the production, and "after ultraviolet irradiation" is the result of evaluation performed after ultraviolet irradiation using the UV conveyor device.

(Haze)

The haze value of the electromagnetic wave absorbing substrate was measured using a haze meter (HM-150N, manufactured by Murakami Color Research Laboratory Co., Ltd.) and calculated based on JIS K 7136 (2000).

Example 1

(Electromagnetic Wave Absorbing Particles)

13.86 g of strontium carbonate ($SrCO_3$, manufactured by Kanto Chemical Co., Ltd., purity of 99.5%) and 6.21 g of niobium oxide ($Nb_2O_5$, manufactured by Kanto Chemical Co., Ltd., purity of 100.0%) were sufficiently mixed so as to be uniform. The obtained mixed powder was placed in an alumina boat and fired at a temperature of 1400° C. for 2 hours in an air atmosphere to obtain strontium niobate having a compositional formula $Sr_4Nb_2O_9$ as an intermediate product.

6.33 g of the obtained $Sr_4Nb_2O_9$, 1.48 g of $Nb_2O_5$, and 0.69 g of niobium powder (Nb, manufactured by Fujifilm Wako Pure Chemical Industries, Ltd., purity of 99.5%) were sufficiently mixed so as to be uniform. At this time, the ratio of the amounts of substance of Sr and Nb after mixing is Sr:Nb=1.0:1.0. 4 g of the obtained mixed powder was taken out, placed in an alumina crucible, and fired at a temperature of 1600° C. for 3 hours under 3% by volume of $H_2$ gas stream with Ar gas as a carrier to obtain strontium niobate having a compositional formula of $SrNbO_z$ ($1.0<z<3.5$) as electromagnetic wave absorbing particles according to Example 1. The subscript of O in the above composition formula is z. The Nb concentration in the obtained strontium niobate was analyzed by an ICP emission spectrometer (model: ICPE-9000, manufactured by Shimadzu Corporation) and the Nb concentration in the obtained strontium niobite was found to be 40%, by mass. In addition, the oxygen concentration was analyzed by a method in which a sample was melted in a He gas using a light element analyzer (model: ON-836, manufactured by LECO Corporation), and CO gas generated by a reaction with carbon in an analysis crucible was quantified by IR absorption spectroscopy. The oxygen concentration was 17% by mass. Each concentration was analyzed three times and the average value thereof was determined. When these results were converted into a mass ratio, the atomic ratio of O/Nb was 2.5 and z of the compositional formula $SrNbO_z$ was 2.5.

(Electromagnetic Wave Absorbing Particle Dispersion Liquid)

A mixed solution (slurry) obtained by mixing 6% by mass of strontium niobate according to Example 1, 6% by mass of an acrylic polymer dispersing agent having an amine-containing group as a functional group (amine value: 48 mgKOH/g, decomposition temperature: 250° C.), and 88% by mass of methyl isobutyl ketone was put into a glass bottle together with $ZrO_2$ beads of φ 0.3 mm, and the glass bottle was placed into a paint shaker and subjected to pulverization/dispersion treatment for 5 hours to obtain an electromagnetic wave absorbing particles dispersion liquid according to Example 1. At this time, the strontium niobate particles become the electromagnetic wave absorbing particles.

When the particle size distribution of the electromagnetic wave absorbing particle dispersion liquid according to Example 1 was measured, the cumulative 50% particle diameter was 34 nm and the cumulative 95% particle diameter was 48 nm.

In addition, when the solvent (dispersion medium) was removed from the electromagnetic wave absorbing particle dispersion liquid and the powder X-ray diffraction pattern of the strontium niobate according to Example 1 was measured, a diffraction peak attributed to a crystal phase of a cubic perovskite structure was confirmed. In addition, when Rietveld analysis was performed based on the cubic perovskite structure, the lattice constant a was calculated to be 4.0284 Å.

When the electromagnetic wave absorbing particle dispersion liquid according to Example 1 was diluted with methyl isobutyl ketone as a solvent and the optical characteristics were measured, the visible light transmittance was 70% and the solar radiation transmittance was 38%. The transmitted light profile of the electromagnetic wave absorbing particle dispersion liquid is illustrated in FIG. 1.

(Electromagnetic Wave Absorbing Particle Dispersion)

The electromagnetic wave absorbing particle dispersion liquid according to Example 1 and an ultraviolet curable resin (ARONIX UV-3701, manufactured by TOAGOSEI Co., Ltd.) were weighed so that the mass ratio was to be 1:1, mixed, and stirred to prepare a dispersion liquid for forming an electromagnetic wave absorbing substrate. Then, the dispersion liquid for forming an electromagnetic wave absorbing substrate was applied onto a clear glass with a 3 mm thickness using a bar coater with a bar No. 10, dried at 70° C. for 1 minute, and irradiated with a high-pressure mercury vapor lamp to obtain an electromagnetic wave absorbing substrate according to Example 1. The electromagnetic wave absorbing substrate is an example of the electromagnetic wave absorbing particle dispersion.

When the optical characteristics of the obtained electromagnetic wave absorbing substrate according to Example 1 were measured, the electromagnetic wave absorbing substrate after the production and before the ultraviolet irradiation indicated that the visible light transmittance was 68% and the solar radiation transmittance was 39. The haze was measured and found to be 0.3%.

The evaluation results are indicated in Tables 1 and 2.

Examples 2 to 4

The mass ratio of Sr:Nb, which is the ratio of the amount of substance between Sr and Nb after mixing $Sr_4Nb_2O_9$, $Nb_2O_5$, and niobium powder, was changed to 0.9:1.0 (Example 2), 0.8:1.0 (Example 3), and 0.7:1.0 (Example 4). Electromagnetic wave absorbing particles according to Examples 2 to 4 were prepared in the same manner as in Example 1 except for the above point.

According to the above-described procedure, strontium niobates having composition formulas of $Sr_{0.9}NbO_z$ ($1.0<z<3.5$) (Example 2), $Sr_{0.8}NbO_z$ ($1.0<z<3.5$) (Example 3), and $Sr_{0.7}NbO_z$ ($1.0<z<3.5$) (Example 4), that are electromagnetic wave absorbing particles, were prepared. In addition, an electromagnetic wave absorbing particle dispersion liquid and an electromagnetic wave absorbing substrate were prepared in the same manner as in Example 1 except that the electromagnetic wave absorbing particles were used, and the same evaluations as in Example 1 were performed. Table 1 and Table 2 indicate the evaluation results in Example 2 to Example 4.

Examples 5 to 7

Barium carbonate ($BaCO_3$, manufactured by FUJIFILM Wako Pure Chemical Industries, Ltd., 99.9% pure) was used instead of strontium carbonate in Example 1 to obtain barium niobate having the compositional formula of $Ba_4Nb_2O_9$. In these Examples, $Ba_4Nb_2O_9$ was used instead of $Sr_4Nb_2O_9$, and the mass ratio of Ba:Nb, which is the ratio of the amount of substance between Ba and Nb after mixing $Ba_4Nb_2O_9$, $Nb_2O_5$, and niobium powder, was 1.0:1.0 (Example 5), 0.8:1.0 (Example 6), and 0.6:1.0 (Example 7). Electromagnetic wave absorbing particles according to Examples 5 to 7 were prepared in the same manner as in Example 1 except for the above point.

According to the above-described procedure, barium niobate having composition formulas of $BaNbO_z$ ($1.0<z<3.5$) (Example 5), $Ba_{0.8}NbO_z$ ($1.0<z<3.5$) (Example 6), and $Ba_{0.6}NbO_z$ ($1.0<z<3.5$) (Example 7) as electromagnetic wave absorbing particles were prepared. In addition, an electromagnetic wave absorbing particle dispersion liquid and an electromagnetic wave absorbing substrate were prepared in the same manner as in Example 1 except that the electromagnetic wave absorbing particles were used, and the same evaluations as in Example 1 were performed. The evaluation results in Examples 5 to 7 are indicated in Tables 1 and 2.

Example 8

Tantalum oxide ($Ta_2O_5$, manufactured by Kanto Chemical Co., Inc., purity of 99.978%) was used instead of niobium oxide in Example 5 to obtain a composition $Ba_4Ta_2O_9$.

Then, the $Ba_4Ta_2O_9$ was mixed with tantalum oxide ($Ta_2O_5$, manufactured by Kanto Chemical Co., Inc., purity of 99.978%) and tantalum powder (Ta, manufactured by Kanto Chemical Co., Inc., purity of 99.9%). At this time, the ratio of the amounts of substance of Ba and Ta after mixing was set to be Ba:Ta=1.0:1.0. Electromagnetic wave absorbing particles according to Example 8 were prepared in the same manner as in Example 5 except for the above point.

According to the above procedure, barium tantalate having a compositional formula of $BaTaO_z$ ($1.0<z<3.5$) was prepared as electromagnetic wave absorbing particles. In addition, an electromagnetic wave absorbing particle dispersion liquid and an electromagnetic wave absorbing substrate were obtained in the same manner as in Example 1 except that the electromagnetic wave absorbing particles were used, and the same evaluations as in Example 1 were performed. The evaluation results are indicated in Tables 1 and 2.

Example 9

The $Sr_4Nb_2O_9$ obtained in Example 1, the $Ba_4Nb_2O_9$ obtained in Examples 5 to 7, $Nb_2O_5$, and niobium powder were mixed. At this time, the ratio of the amounts of substances of Sr, Ba, and Nb after mixing was set to be Sr:Ba:Nb=0.5:0.5:1.0. Electromagnetic wave absorbing particles according to Example 9 were prepared in the same manner as in Example 1 except for the above point.

According to the above-described procedure, strontium barium niobate having a compositional formula of $Sr_{0.5}Ba_{0.5}NbO_z$ (1.0<z<3.5) was prepared as electromagnetic wave absorbing particles. In addition, an electromagnetic wave absorbing particle dispersion liquid and an electromagnetic wave absorbing substrate were obtained in the same manner as in Example 1 except that the electromagnetic wave absorbing particles were used, and the same evaluations as in Example 1 were performed. The evaluation results are indicated in Tables 1 and 2.

Example 10

Calcium niobate having the compositional formula $Ca_4Nb_2O_9$ was obtained by using calcium carbonate ($CaCO_3$, manufactured by Kanto Chemical Co., Ltd., purity of 99.5%) instead of strontium carbonate used in Example 1.

Then, the $Ca_4Nb_2O_9$, $Nb_2O_5$, and niobium powder were mixed. At this time, the ratio of the amounts or substance of Ca and Nb after mixing was set to Ca:Nb=1.0:1.0. Electromagnetic wave absorbing particles according to Example 10 were prepared in the same manner as in Example 1 except for the above point.

According to the above-described procedure, calcium niobate having a compositional formula of $CaNbO_z$ (1.0<z<3.5) as electromagnetic wave absorbing particles was prepared. In addition, an electromagnetic wave absorbing particle dispersion liquid and an electromagnetic wave absorbing substrate were obtained in the same manner as in Example 1 except that the electromagnetic wave absorbing particles were used, and the same evaluations as in Example 1 were performed. The evaluation results are indicated in Tables 1 and 2.

Reference Example 1

54.9 g of $SnCl_4 \cdot 5H_2O$ (manufactured by Wako Pure Chemical Industries, Ltd., 98% or higher in purity) was dissolved in 340 g of water at 25° C. to prepare a tin compound solution. To the tin compound solution, 12.7 ml of a methanol solution (manufactured by Yoneyama Yakuhin Kogyo Co., Ltd., reagent special grade, purity of 99.8% or more) in which 4.2 g of an antimony compound $SbCl_3$ (manufactured by Wako Pure Chemical Industries, JIS special grade, purity of 98% or more) is dissolved, and an aqueous $NH_4OH$ solution (manufactured by Wako Pure Chemical Industries, special grade reagent, concentration of 30%), which is an alkaline solution diluted to a concentration of 16%, were added dropwise in parallel. By the parallel dropping, a hydroxide containing tin and antimony, which is a precursor of antimony-doped tin oxide (hereinafter abbreviated as ATO) electromagnetic wave absorbing particles, was generated and precipitated.

From the viewpoint of desired optical characteristics, the amount of the antimony compound added to the tin compound solution was 9.5 parts by mass in terms of antimony element with respect to 100 parts by mass of tin (IV) oxide. When the additive amount is as described above, ATO electromagnetic wave absorbing particles containing about 68% by mass of Sn element and about 8% by mass of Sb element can be produced.

As described above, ammonia water was used as the alkali solution used as the precipitant, and the alkali concentration was set to 16% which is 1.6 times the chemical equivalent required for the tin compound and the antimony compound to become hydroxides.

The parallel dropping time of the methanol solution and the alkaline solution was set to 25 minutes, and parallel dropping was performed until the pH of the solution obtained by the dropping reached pH 7.5. Even after the dropwise addition, the solution was continuously stirred for 10 minutes in order to homogenize the system. The temperature of the solution at that time was set to 65° C., which was the same temperature as the temperature during parallel dropping.

Next, the precipitate was washed by repeated decantation. Washing was performed sufficiently until the conductivity of the supernatant liquid of the washing liquid in the decanting became 1 mS/cm or less, and filtration was performed.

Next, the washed precipitate was wet-treated with an anhydrous ethyl alcohol solution (special grade reagent, purity of 99.5% or more, manufactured by Wako Pure Chemical Industries, Ltd.). In the wetting treatment, the mass ratio of the filtered precipitate to the anhydrous ethyl alcohol solution was set to 1:4 (corresponding to 80% alcohol), and the filtered precipitate and the anhydrous ethyl alcohol solution were stirred at room temperature for 1 hour to obtain a precursor. After completion of the wetting treatment, the precursor was dried at 90° C. for 10 hours to obtain a dried product.

Then, the ATO electromagnetic wave absorbing particle precursor subjected to the wetting treatment was heated to 700° C. under an air atmosphere and fired for 2 hours to produce the ATO electromagnetic wave absorbing particles according to Reference Example An electromagnetic wave absorbing particle dispersion liquid and an electromagnetic wave absorbing substrate according to Reference Example 1 were prepared in the same manner as in Example 1 except that the ATO electromagnetic wave absorbing particles according to Reference Example 1 were used as the electromagnetic wave absorbing particles instead of the strontium niobate particles, and the same evaluations as in Example 1 were performed. The evaluation results in Reference Example 1 are indicated in Tables 1 and 2.

TABLE 1

| | | | Electromagnetic wave absorbing particles | | Electromagnetic wave absorbing particle dispersion liquid | | | |
|---|---|---|---|---|---|---|---|---|
| | Compound | Intermediate product | Crystal structure | Lattice constant (Å) | Cummulative 50% particle size (nm) | Cummulative 90% particle size (nm) | Visible light transmittance (%) | Solar transmittance (%) |
| Example 1 | $SrNbO_z$ | $Sr_4Nb_2O_9$ | Cubic perovskite-type structure | 4.0284 | 34 | 48 | 70 | 38 |
| Example 2 | $Sr_{0.9}NbO_z$ | $Sr_4Nb_2O_9$ | Cubic perovskite-type structure | 4.0142 | 33 | 46 | 70 | 37 |

TABLE 1-continued

| | Compound | Intermediate product | Electromagnetic wave absorbing particles: Crystal structure | Electromagnetic wave absorbing particles: Lattice constant (Å ) | Electromagnetic wave absorbing particle dispersion liquid: Cummulative 50% particle size (nm) | Electromagnetic wave absorbing particle dispersion liquid: Cummulative 90% particle size (nm) | Visible light transmittance (%) | Solar transmittance (%) |
|---|---|---|---|---|---|---|---|---|
| Example 3 | $Sr_{0.8}NbO_z$ | $Sr_4Nb_2O_9$ | Cubic perovskite-type structure | 3.9987 | 34 | 47 | 70 | 37 |
| Example 4 | $Sr_{0.7}NbO_z$ | $Sr_4Nb_2O_9$ | Cubic perovskite-type structure | 3.9833 | 34 | 47 | 70 | 41 |
| Example 5 | $BaNbO_z$ | $Ba_4Nb_2O_9$ | Cubic perovskite-type structure | 4.0924 | 33 | 48 | 70 | 35 |
| Example 6 | $Ba_{0.8}NbO_z$ | $Ba_4Nb_2O_9$ | Cubic perovskite-type structure | 4.0622 | 34 | 47 | 70 | 36 |
| Example 7 | $Ba_{0.6}NbO_z$ | $Ba_4Nb_2O_9$ | Tetragonal | | 34 | 48 | 70 | 44 |
| Example 8 | $BaTaO_z$ | $Ba_4Ta_2O_9$ | Orthorhombic | | 35 | 49 | 70 | 45 |
| Example 9 | $Sr_{0.5}Ba_{0.5}NbO_z$ | $Sr_4Nb_2O_9$ $Ba_4Nb_2O_9$ | Cubic perovskite-type structure | | 34 | 48 | 70 | 40 |
| Example 10 | $CaNbO_z$ | $Ca_4Nb_2O_9$ | Cubic perovskite-type structure | | 35 | 49 | 70 | 45 |
| Reference Example 1 | ATO fine particles | | | | 34 | 47 | 70 | 48 |

TABLE 2

| | Optical properties in UV irradiation test: Initial | | | After UV irradiation | | |
|---|---|---|---|---|---|---|
| | Visible light transmittance (%) | Solar transmittance (%) | Haze (%) | Visible light transmittance (%) | Solar transmittance (%) | Haze (%) |
| Example 1 | 68 | 39 | 0.3 | 67 | 38 | 0.3 |
| Example 2 | 69 | 40 | 0.3 | 69 | 39 | 0.3 |
| Example 3 | 69 | 39 | 0.3 | 69 | 38 | 0.3 |
| Example 4 | 69 | 42 | 0.3 | 68 | 40 | 0.3 |
| Example 5 | 69 | 38 | 0.3 | 68 | 37 | 0.3 |
| Example 6 | 69 | 40 | 0.3 | 69 | 39 | 0.3 |
| Example 7 | 69 | 44 | 0.3 | 68 | 43 | 0.3 |
| Example 8 | 70 | 45 | 0.3 | 69 | 44 | 0.3 |
| Example 9 | 69 | 41 | 0.3 | 68 | 40 | 0.3 |
| Example 10 | 69 | 45 | 0.3 | 68 | 44 | 0.3 |
| Reference Example 1 | 70 | 49 | 0.3 | 69 | 48 | 0.3 |

According to the results indicated in Table 1 and Table 2, it could be confirmed that the electromagnetic wave absorbing substrates that are the electromagnetic wave absorbing particle dispersion liquids and the electromagnetic wave absorbing particle dispersions using the electromagnetic wave absorbing particles obtained in Example 1 to Example 10 have high visible light transmittance and can suppress solar radiation transmittance. That is, it was confirmed that the electromagnetic wave absorbing particle dispersion liquids and the electromagnetic wave absorbing substrates obtained in Examples 1 to 10 have high transmittance in the visible light region and can suppress the transmittance in the infrared region.

In addition, it was also confirmed that the optical characteristics after ultraviolet irradiation indicated in the column of "after ultraviolet irradiation" in Table 2 for the electromagnetic wave absorbing substrates that are the electromagnetic wave absorbing particle dispersions obtained in Examples 1 to 10 did not appreciably change from the optical characteristics after the production indicated in the column of "initial". Therefore, it was confirmed that the electromagnetic wave absorbing substrates obtained in Examples 1 to 10 did not indicate a large change in optical characteristics even in an environment in which ultraviolet rays were irradiated for a long period of time, and had excellent durability.

It was also confirmed that the visible light transmittance and the solar radiation transmittance were equal to or better than those of ATO conventionally used as electromagnetic wave absorbing particles. Therefore, it could be confirmed that the electromagnetic wave absorbing particles obtained in Examples 1 to 10 were practically usable novel electromagnetic wave absorbing particles.

This application claims priority under Japanese Patent Application No. 2021-015182 filed Feb. 2, 2021, and the entire contents of Japanese Patent Application No. 2021-015182 are incorporated herein by reference.

The invention claimed is:

1. An electromagnetic wave absorbing particle dispersion liquid comprising:

a liquid medium; and electromagnetic wave absorbing particles contained in the liquid medium, wherein the electromagnetic wave absorbing particles contain a composite oxide that includes:

an element A that is one or more elements selected from Ca, Sr, and Ba; and an element B that is one or more elements selected from Nb and Ta, a relationship of $0.7 \leq x/y \leq 1.0$ is satisfied when an amount of substance of the element A contained in the composite oxide is x and an amount of substance of the element B is y, a relationship of $3.0 < z/y < 3.5$ is satisfied when an amount of substance of oxygen contained in the composite oxide is z, and the composite oxide has a crystal structure of at least one of tetragonal and orthorhombic.

2. The electromagnetic wave absorbing particle dispersion liquid according to claim 1, wherein the liquid medium contains one or more liquid media selected from water, an organic solvent, a liquid plasticizer, an oil, and a compound that is polymerized by curing.

3. The electromagnetic wave absorbing particle dispersion liquid according to claim 1, wherein the electromagnetic wave absorbing particles have a cumulative 50% particle diameter on a volume basis of 1 nm or more and 50 nm or less, and a cumulative 95% particle diameter on a volume basis of 5 nm or more and 100 nm or less, as measured by a particle size distribution analyzer.

4. The electromagnetic wave absorbing particle dispersion liquid according to claim 1, wherein the element B is Nb.

5. An electromagnetic wave absorbing particle dispersion comprising:

a solid medium; and electromagnetic wave absorbing particles contained in the solid medium, wherein the electromagnetic wave absorbing particles contain a composite oxide that includes:

an element A that is one or more elements selected from Ca, Sr, and Ba; and an element B that is one or more elements selected from Nb and Ta, a relationship of $0.7 \leq x/y \leq 1.0$ is satisfied when an amount of substance of the element A contained in the composite oxide is x and an amount of substance of the element B is y, a relationship of $3.0 < z/y < 3.5$ is satisfied when an amount of substance of oxygen contained in the composite oxide is z, and the composite oxide has a crystal structure of at least one of tetragonal and orthorhombic.

6. The electromagnetic wave absorbing particle dispersion according to claim 5, wherein the solid medium is a resin.

7. The electromagnetic wave absorbing particle dispersion according to claim 6, wherein the resin is selected from the group consisting of a polyester resin, a polycarbonate resin, an acrylic resin, a styrene resin, a polyamide resin, a polyethylene resin, a vinyl chloride resin, an olefin resin, an epoxy resin, a polyimide resin, a fluororesin, an ethylene-vinyl acetate copolymer, a polyvinyl acetal resin, an ultraviolet curable resin, and a mixture thereof.

8. The electromagnetic wave absorbing particle dispersion according to claim 5, wherein the electromagnetic wave absorbing particle dispersion is provided in a sheet shape, a board shape, or a film shape.

9. An electromagnetic wave absorbing laminate comprising:

the electromagnetic wave absorbing particle dispersion of claim 5; and a transparent substrate.

10. The electromagnetic wave absorbing particle dispersion liquid according to claim 5, wherein the electromagnetic wave absorbing particles have a cumulative 50% particle diameter on a volume basis of 1 nm or more and 50 nm or less, and a cumulative 95% particle diameter on a volume basis of 5 nm or more and 100 nm or less, as measured by a particle size distribution analyzer.

11. The electromagnetic wave absorbing particle dispersion liquid according to claim 5, wherein the element B is Nb.

* * * * *